US012635313B2

(12) United States Patent
Kim et al.

(10) Patent No.: US 12,635,313 B2
(45) Date of Patent: May 19, 2026

(54) TRANSFER METHOD OF ALIGNING, PLACING, AND BONDING MICRO SEMICONDUCTOR CHIPS ON SUBSTRATE

(71) Applicant: SAMSUNG ELECTRONICS CO., LTD., Suwon-si (KR)

(72) Inventors: Hyunjoon Kim, Suwon-si (KR); Seogwoo Hong, Suwon-si (KR); Dongkyun Kim, Suwon-si (KR); Dongho Kim, Suwon-si (KR); Joonyong Park, Suwon-si (KR); Sanghoon Song, Suwon-si (KR); Kyungwook Hwang, Suwon-si (KR); Junsik Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 677 days.

(21) Appl. No.: 18/084,186

(22) Filed: Dec. 19, 2022

(65) Prior Publication Data

US 2024/0006563 A1      Jan. 4, 2024

(30) Foreign Application Priority Data

Jun. 30, 2022      (KR) ........................ 10-2022-0080856

(51) Int. Cl.
H10H 20/85          (2025.01)
H10H 20/01          (2025.01)
(Continued)

(52) U.S. Cl.
CPC ...... H10H 20/8506 (2025.01); H10H 20/857 (2025.01); H10W 90/00 (2026.01); H10H 20/0364 (2025.01)

(58) Field of Classification Search
CPC ............. H10H 20/8506; H10H 20/857; H10H 20/0364; H10H 20/018; H10H 29/142; H01L 25/0753; H01L 2221/68318; H01L 2221/68354; H01L 2221/68368; H01L 2221/68381; H01L 21/6835; H01L 24/95; H10D 86/40
See application file for complete search history.

(56) References Cited

U.S. PATENT DOCUMENTS 5,783,856 A * 7/1998 Smith ..................... H01L 24/24
257/E21.705
9,722,145 B2    8/2017 Sasaki et al.
(Continued)

FOREIGN PATENT DOCUMENTS

CN         101923279 A  * 12/2010
KR    10-2020-0007205 A      1/2020

*Primary Examiner* — Brian Turner
*Assistant Examiner* — Zhijun Xu
(74) *Attorney, Agent, or Firm* — Sughrue Mion, PLLC

(57) ABSTRACT

Disclosed are a method of transferring semiconductor chips. The method may include providing a first substrate, adhering a support substrate to the first substrate, supplying and aligning a plurality of semiconductor chips, partially adhering a second substrate to a first surface of the first substrate, separating the support substrate from the first substrate, and adhering the plurality of semiconductor chips to the second substrate by supplying a fluid to a periphery of a second surface of the first substrate and applying a pressure to the second surface.

19 Claims, 26 Drawing Sheets

(51) Int. Cl.
    *H10H 20/857*      (2025.01)
    *H10W 90/00*      (2026.01)

(56)            References Cited

U.S. PATENT DOCUMENTS

| | | | |
|---|---|---|---|
| 9,825,202 | B2 | 11/2017 | Schuele et al. |
| 9,917,226 | B1 | 3/2018 | Heine et al. |
| 10,243,097 | B2 | 3/2019 | Yuen et al. |
| 10,418,527 | B2 | 9/2019 | Sasaki et al. |
| 10,475,958 | B2 | 11/2019 | Zhan et al. |
| 10,629,471 | B2 | 4/2020 | Ahn et al. |
| 10,825,702 | B2 | 11/2020 | Shim et al. |
| 11,152,328 | B2 | 10/2021 | Ma et al. |
| 2007/0155129 | A1* | 7/2007 | Thallner ........... H01L 21/02002 |
| | | | 438/455 |
| 2008/0284035 | A1* | 11/2008 | Brunnbauer ............ H01L 24/97 |
| | | | 257/773 |
| 2013/0328093 | A1 | 12/2013 | Lin |
| 2017/0062650 | A1 | 3/2017 | Chen et al. |
| 2017/0062683 | A1 | 3/2017 | Chen et al. |
| 2017/0133558 | A1* | 5/2017 | Sasaki ................ H10H 20/8506 |
| 2017/0263837 | A1* | 9/2017 | Jeon ........................ H01L 24/19 |
| 2018/0166429 | A1 | 6/2018 | Chong et al. |
| 2020/0194401 | A1* | 6/2020 | Ma ........................... H01L 24/75 |
| 2022/0093423 | A1* | 3/2022 | Colosimo ......... H01L 21/67132 |
| 2022/0189810 | A1 | 6/2022 | Hwang et al. |
| 2022/0384236 | A1* | 12/2022 | Zhai ........................ H01L 24/95 |

* cited by examiner

TRANSFER METHOD OF ALIGNING, PLACING, AND BONDING MICRO SEMICONDUCTOR CHIPS ON SUBSTRATE

CROSS-REFERENCE TO RELATED APPLICATION

This application is based on and claims priority under 35 U.S.C. § 119 to Korean Patent Application No. 10-2022-0080856, filed on Jun. 30, 2022, in the Korean Intellectual Property Office, the disclosure of which is incorporated by reference herein in its entirety.

BACKGROUND

1. Field

The present disclosure relates to a method of transferring micro semiconductor chips.

2. Description of the Related Art

Light-emitting diodes (LEDs) have advantages of low power consumption and eco-friendliness. Due to the advantages, industrial demand thereof is increasing. LEDs are being applied not only to lighting devices or LCD backlights, but also to LED display devices. In other words, a display device using micro-unit LED chips is being developed. To manufacture a micro-LED display device, it is necessary to transfer micro-LEDs to a substrate. As a method of transferring micro-LEDs, a pick-and-place method is widely used. However, in such a method, as the size of micro-LEDs is reduced and the size of a display device increases, the productivity is lowered.

SUMMARY

Provided is a transfer method of aligning, placing, and bonding micro semiconductor chips on a substrate.

According to an aspect of the disclosure, a method of transferring a semiconductor chip comprises providing a first substrate having a first surface provided with a plurality of grooves and a second surface opposite to the first surface; adhering a support substrate having a higher rigidity than the first substrate to the second surface of the first substrate; supplying and aligning a plurality of semiconductor chips to the plurality of grooves of the first substrate; disposing a second substrate to face the first surface of the first substrate and partially adhering the second substrate to the first substrate; separating the support substrate from the first substrate; and adhering the plurality of semiconductor chips to the second substrate by supplying a fluid to a periphery of the second surface and applying a pressure to the second surface.

The first substrate comprises a base film having a material less rigid than that of the support substrate and a pattern layer disposed on the base film and having a pattern corresponding to the plurality of grooves.

The base film comprises at least one of polyethylene terephthalate (PET) and polyimide the step of providing of the first substrate comprises: forming a polymer layer on one surface of the base film; and forming the pattern corresponding to the plurality of grooves on the polymer layer (PI).

The plurality of grooves are formed in the polymer layer of the first substrate through an imprinting process.

The support substrate is adhered to the second surface of the first substrate by using an adhesive layer, and the support substrate is separated from the first substrate by weakening adhesive force of the adhesive layer.

The second substrate is adhered to the first substrate by solder balls arranged in regions between the first substrate and the second substrate.

The plurality of grooves are not arranged in the regions between the first substrate and the second substrate.

The method further comprises, after the step of adhering of the plurality of semiconductor chips to the second substrate, separating the first substrate adhered to the second substrate from the second substrate by weakening a adhering strength of the solder balls.

The method further comprises, before the step of separating of the support substrate from the first substrate, turning upside down an assembly in which the first substrate, the second substrate, and the support substrate are connected to one another, such that the support substrate faces upward.

The steps of supplying and aligning of the plurality of semiconductor chips are performed according to a fluid self-assembly method.

The fluid self-assembly method comprises: supplying a liquid to the plurality of grooves; and aligning the plurality of semiconductor chips with the plurality of grooves by scanning the first substrate by using an absorbing member capable of absorbing the liquid.

The steps of supplying and aligning of the plurality of semiconductor chips to the plurality of grooves further comprise arranging the plurality of semiconductor chips, such that electrodes of each of the plurality of semiconductor chips face upward.

A curve is formed on the second surface of the first substrate according to a structure between the second substrate and the first substrate due to the pressure applied to the second surface.

Heights of some of the plurality of semiconductor chips are different from heights of other semiconductor chips of the plurality of semiconductor chips, or depths of some of the plurality of grooves are different from depths of other grooves of the plurality of grooves.

A gas is supplied at a preset pressure into a chamber in which the first substrate and the second substrate partially adhered to each other are placed, and the first substrate is pressed in a direction toward the second substrate by the gas supplied into the chamber, and the plurality of semiconductor chips contacts with and pressed against the second substrate.

The step of adhering of the plurality of semiconductor chips to the second substrate further comprises heating the plurality of semiconductor chips to be adherable to the second substrate.

The second substrate comprises a driving circuit board comprising a thin-film transistor, and the second substrate and the plurality of semiconductor chips are electrically connected to each other.

The semiconductor chips comprise at least one of a light-emitting device and a memory chip.

Additional aspects will be set forth in part in the description which follows and, in part, will be apparent from the description, or may be learned by practice of the presented embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 3 illustrates an example of a process of forming a plurality of grooves in a base film in the method of transferring micro semiconductor chips according to an embodiment;

FIG. 4 illustrates a process in which a plurality of grooves are formed in a base film through a roll-to-roll process in a method of transferring micro semiconductor chips according to an embodiment;

FIGS. 11 to 13 illustrate an operation of partially and temporarily adhering a second substrate to a first substrate in the method of transferring micro semiconductor chips according to an embodiment;

FIGS. 14 to 17 illustrate an operation of separating a support substrate from a first substrate in the method of transferring micro semiconductor chips according to an embodiment;

DETAILED DESCRIPTION

Figure 1:
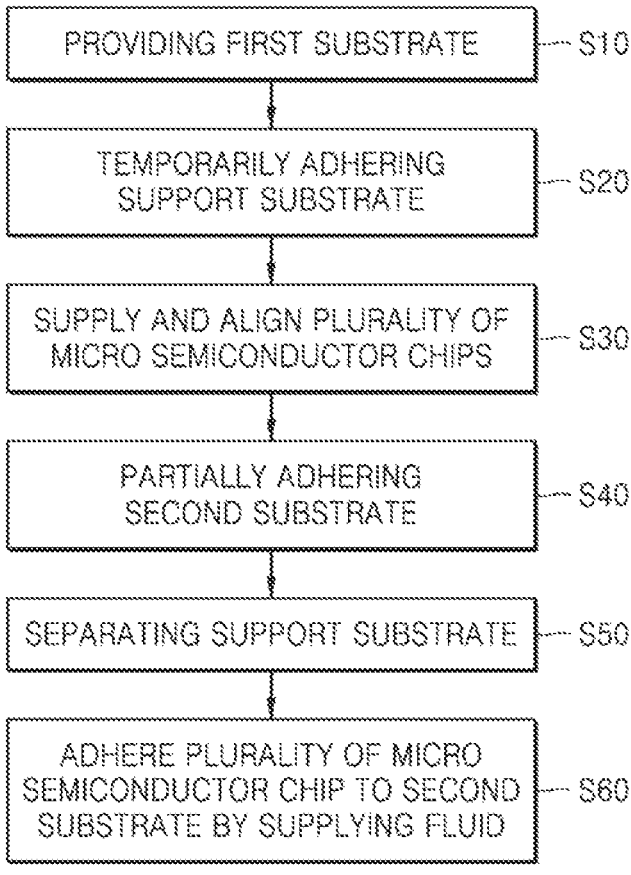
FIG. 1 illustrates a method of transferring micro semiconductor chips, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a method of transferring a micro semiconductor chip according to various embodiments will be described in detail with reference to the accompanying drawings. In the drawings, like reference numerals denote like elements, and the size and thickness of each element may be exaggerated for clarity of explanation. While such terms as "first," "second," etc., may be used to describe various elements, such elements must not be limited to the above terms. The above terms are used only to distinguish one component from another.

An expression used in the singular encompasses the expression of the plural, unless it has a clearly different meaning in the context. In addition, unless explicitly described to the contrary, the word "comprise" and variations such as "comprises" or "comprising" will be understood to imply the inclusion of stated elements but not the exclusion of any other elements. Also, the size or the thickness of each component in the drawings may be exaggerated for clarity of description.

The use of the terms "the" and similar indication words may refer to both singular and plural.

Operations that constitute a method may be performed in any suitable order, unless explicitly stated to be done in an order described. Furthermore, the use of all exemplary terms (e.g., etc.) is merely intended to be illustrative of technical ideas and is not to be construed as limiting the scope of the term unless further limited by the claims.

Figure 2:
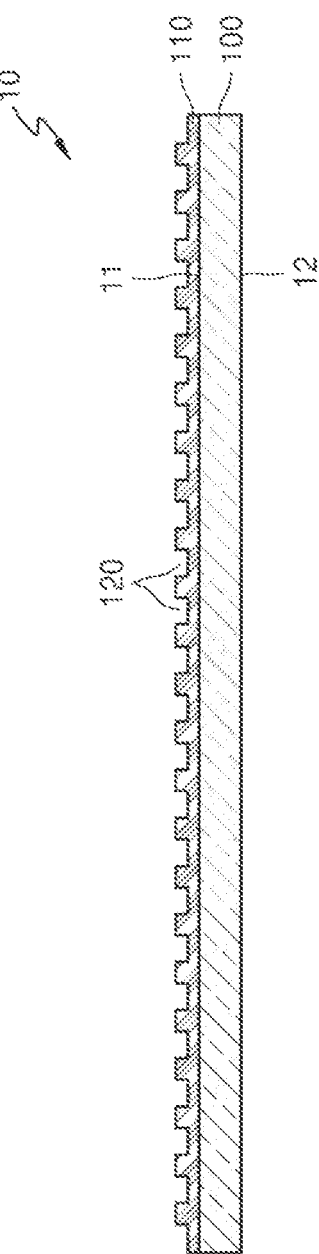
FIG. 2 illustrates an example of a first substrate used in the method of transferring a micro semiconductor chip according to an embodiment.

FIG. 1 illustrates a method of transferring a (micro) semiconductor chip according to an embodiment. FIG. 2 illustrates an example of a first substrate used in the method of transferring a micro semiconductor chip according to an embodiment. Referring to FIGS. 1 and 2, in the method of transferring a micro semiconductor chip, according to an embodiment, a first substrate 10 is first prepared (operation S10).

According to an embodiment of the present disclosure, the first substrate 10 has a first surface 11 having a plurality of grooves 120 and a second surface 12 opposite to the first surface 11. The first substrate 10 may include a heat-resistant material. For example, the first substrate 10 may include a material capable of withstanding a temperature of about 280° C. The first substrate 10 may include at least one of polyethylene terephthalate (PET) and polyimide (PI).

The plurality of grooves 120 may each have a size into which a semiconductor chip 1 to be described below may be fitted. A micro semiconductor chip is discussed herein as an example of a semiconductor chip. The present disclosure is not limited to the micro semiconductor chip and embodiments of the present disclosure may be implemented in other types of semiconductor chips. According to an embodiment, each of the plurality of grooves 120 may have a size into which the micro semiconductor chip 1 may fit. According to another embodiment, the plurality of grooves 120 may each have a size into which a plurality of micro semiconductor chips 1 may respectively fit. The plurality of grooves 120 may have cross-sections of various shapes, such as a triangular cross-section, a rectangular cross-section, a circular cross-section, etc.

Figure 3:
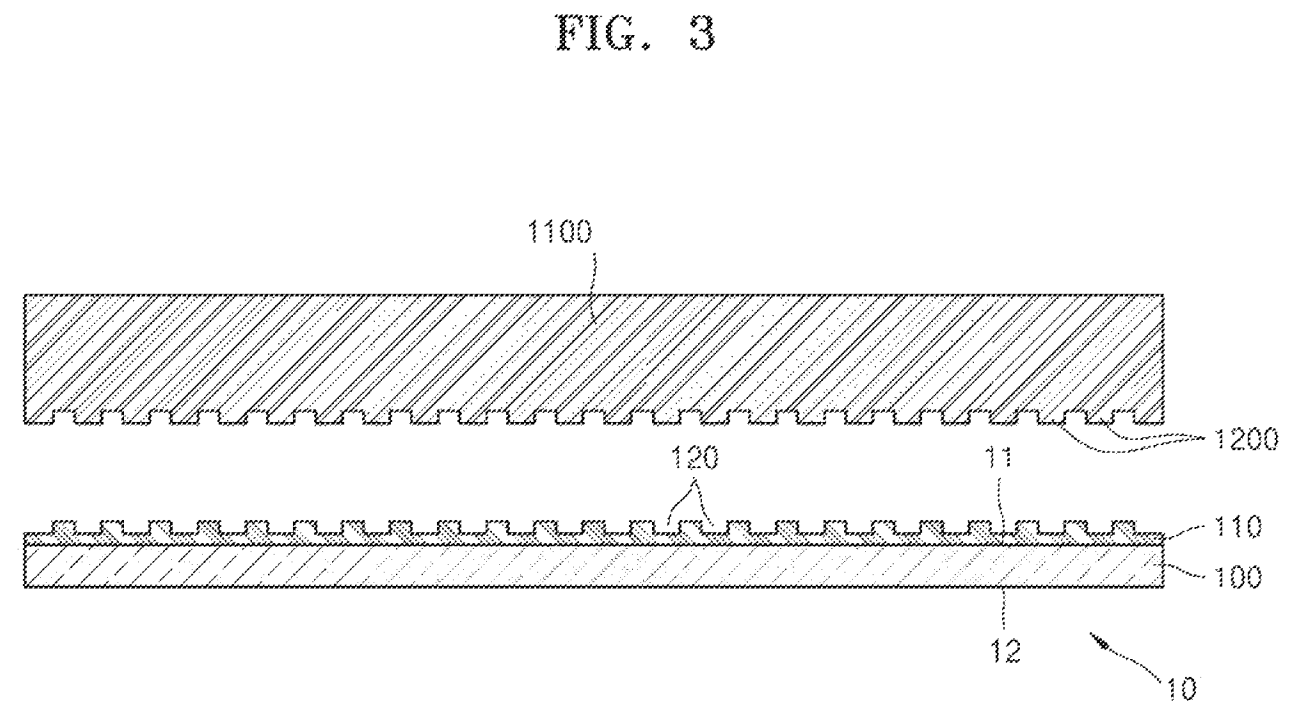
Figure 4:
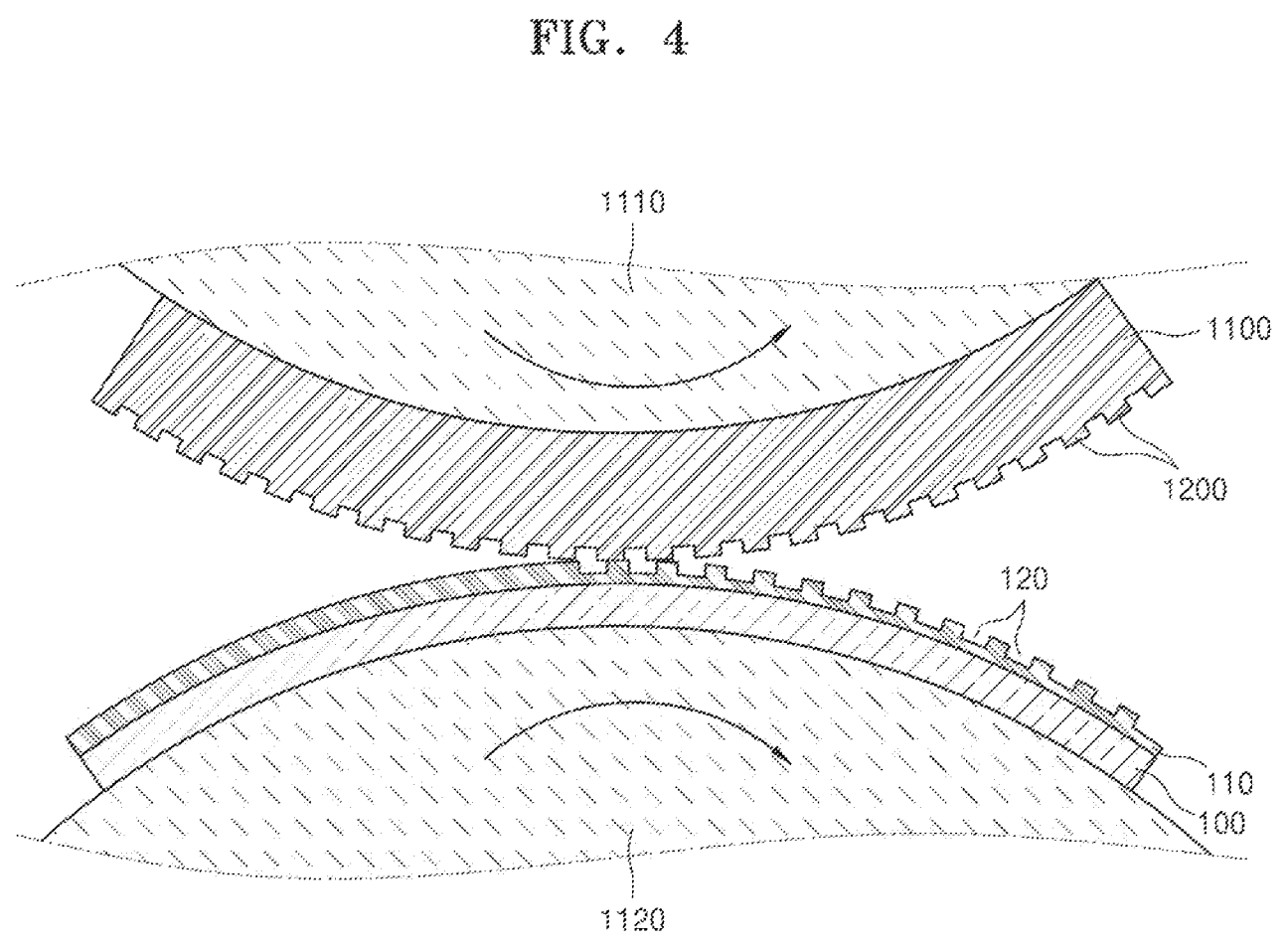

FIG. 3 illustrates a process of forming the plurality of grooves 120 in the first substrate 10 in a method of transferring the micro semiconductor chip 1 according to an embodiment. FIG. 4 is a diagram for describing an example of a process of forming the plurality of grooves 120.

Referring to FIG. 3, the preparing of the first substrate 10 may include forming a pattern corresponding to the plurality of grooves 120 on the first substrate 10. In the forming of the pattern, an imprinting technique may be used. For example, the first substrate 10 may be pressed by a pattern master 1100 provided with a plurality of protrusions 1200. As the pattern master 1100 presses the first substrate 10, the plurality of grooves 120, which are respectively corresponding to the plurality of protrusions 1200, may be formed in the first substrate 10. The material constituting the pattern master 1100 may include any one or more of a metal material, a silicon material, and a polymer material.

The first substrate 10 may include a base film 100 including a flexible material and a pattern layer 110 disposed on the base film 100. The base film 100 may include at least one of PET and PI. The pattern layer 110 may include a material different from that constituting the base film 100. For example, the pattern layer 110 may include a polymer different from that constituting the base film 100.

The preparation of the first substrate 10 may include forming a polymer layer 111 on one surface of the base film 100 and forming a pattern corresponding to the plurality of grooves 120 on the polymer layer 111. In the forming of the polymer layer 111, a polymer may be applied on the base film 100. To form a pattern corresponding to the plurality of grooves in the polymer layer 111, the polymer layer 111 may be pressed by the pattern master 1100. A layer in which the plurality of grooves 120 are formed may be referred to as a pattern layer 110. When the plurality of grooves 120 are formed in the polymer layer 111, the polymer layer 111 may be referred to as the pattern layer 110. As an embodiment of an imprinting process, a roll-to-roll process may be utilized.

FIG. 4 illustrates a process of forming the plurality of grooves 120 in the first substrate 10 through a roll-to-roll process in the method of transferring a micro semiconductor chip according to an embodiment.

Referring to FIG. 4, the pattern master 1100 provided with the plurality of protrusions 1200 may be disposed on an upper roller 1110. When the first substrate 10 is inserted between the upper roller 1110 and a lower roller 1120, the top surface of the first substrate 10 is pressed by the pattern master 1100 while the upper roller 1110 and the lower roller 1120 are revolving. As the top surface of the first substrate 10 is pressed by the pattern master 1100 having the plurality of protrusions 1200, the plurality of grooves 120 are formed in the first surface 11 of the first substrate 10 by the plurality of protrusions 1200 on the pattern master 1100. In the embodiment described above, the imprinting process is provided as an example of a process of forming the plurality of grooves 120 in the first substrate 10, but the present disclosure is not limited thereto. For example, as a process of forming the plurality of grooves 120 in the first substrate 10, a photolithography process may be used.

Figure 5:
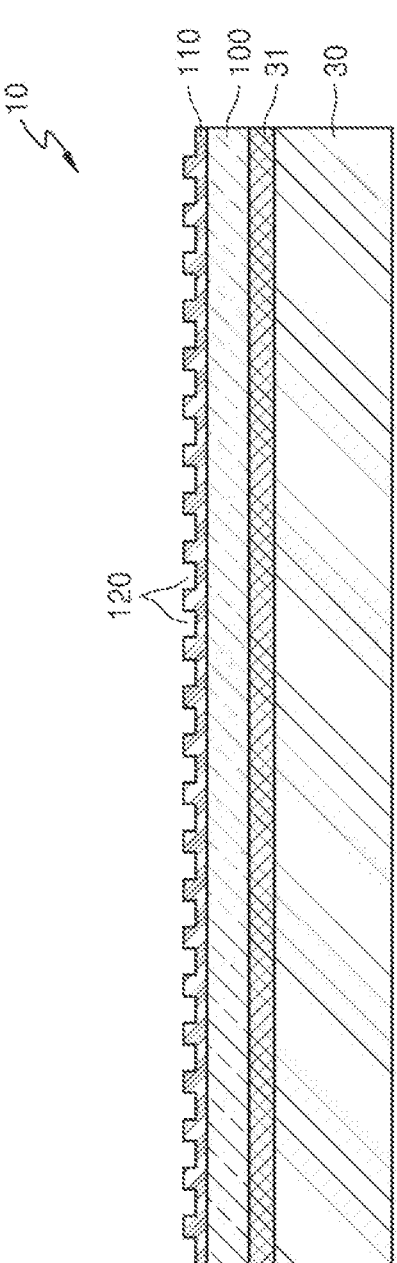
FIG. 5 illustrates an operation of temporarily adhering a first substrate and a support substrate in the method of transferring micro semiconductor chips according to an embodiment.

FIG. 5 illustrates an operation of (temporarily) adhering a support substrate 30 to the first substrate 10 in the method of transferring the micro semiconductor chip 1 according to an embodiment.

Referring to FIGS. 1 and 5, in the method of transferring the micro semiconductor chip 1 according to an embodiment, the support substrate 30 is temporarily adhered to the second surface 12 of the first substrate 10 in which the plurality of grooves 120 are provided (operation S20). The support substrate 30 may be a substrate having a higher rigidity than the first substrate 10.

The support substrate 30 may support the first substrate 10 including a flexible material. In subsequent operations, the support substrate 30 may maintain the shape of the first substrate 10, and thus, distances between the plurality of grooves 120 may be maintained. When the first substrate 10 is not supported by the support substrate 30, the first substrate 10 may deform, and thus, it may be difficult to maintain the distances between the plurality of grooves 120.

The support substrate 30 may be temporarily adhered to the second surface 12 of the first substrate 10 via an adhesive layer 31. That is, the support substrate 30 may be detached from the first substrate 10 after a certain period of time is elapsed. The adhesive layer 31 may include a material having adhesive strength that is weakened by ultraviolet (UV) ray irradiation or temperature change. However, the material constituting the adhesive layer 31 is not limited thereto and may include a material having adhesive strength that is weakened by a change other than a change in an applied frequency or a change in temperature or a material that may be removed by a physical or chemical reaction. The thickness of the adhesive layer 31 may be negligible compared to the thickness of the support substrate 30 or the first substrate 10. The adhesive layer 31 may be removed in an operation of separating the support substrate 30 to be described below.

Figure 6:
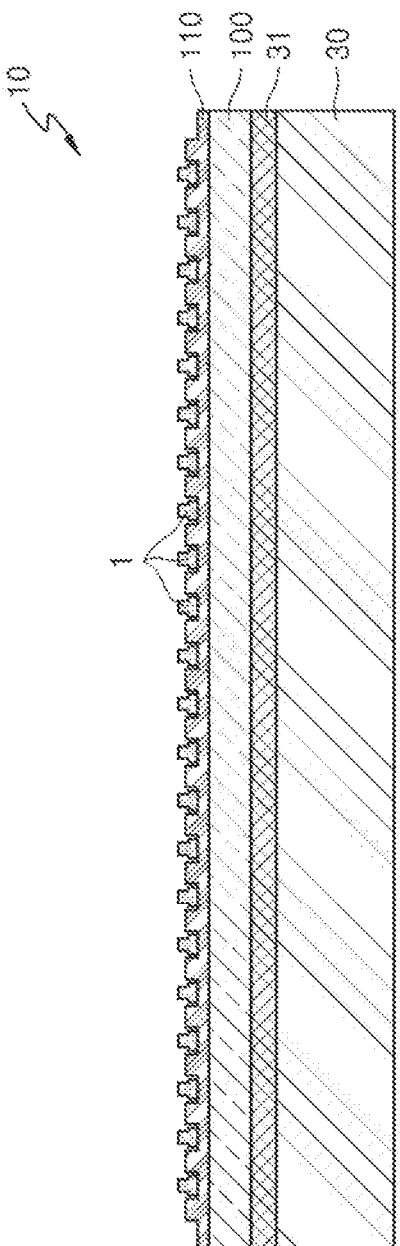
FIG. 6 illustrates a state in which a plurality of micro semiconductor chips are supplied to a first substrate and aligned in the method of transferring micro semiconductor chips according to an embodiment.

FIG. 6 illustrates a state in which a plurality of micro semiconductor chips 1 are supplied to the first substrate 10 and aligned in the method of transferring a micro semiconductor chip according to an embodiment. Referring to FIGS. 1 and 5, the plurality of micro semiconductor chips 1 may be supplied to and aligned with the plurality of grooves 120 of the first substrate 10 to which the support substrate 30 is adhered (operation S30). The supplying and aligning of the plurality of micro semiconductor chips 1 with the plurality of grooves 120 of the first substrate 10 may be performed according to a fluid self-assembly method. The fluid self-assembly method may include preparing a liquid in which the plurality of micro semiconductor chips 1 are stirred; supplying the liquid to the plurality of grooves 120; and aligning the plurality of micro semiconductor chips 1 with the plurality of grooves 120 by scanning the first substrate with an absorbing member capable of absorbing the liquid.

FIGS. 7 to 10 illustrate the operation of supplying and aligning the plurality of micro semiconductor chips 1 by using a wet transfer method in the method of transferring the micro semiconductor chip 1 according to an embodiment. The supplying and aligning of the plurality of micro semiconductor chips 1 by using a fluid self-assembly method are described with reference to FIGS. 7 to 9.

Figure 7:
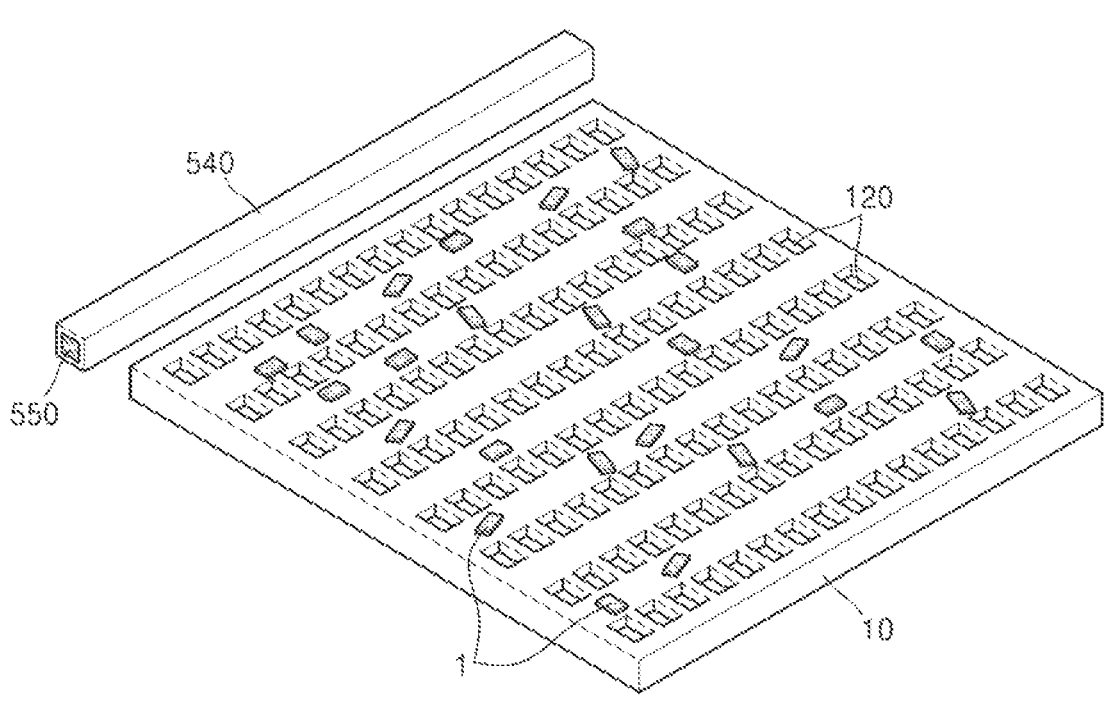
FIGS. 7 to 10 illustrate the operation of supplying and aligning a plurality of micro semiconductor chips by using a wet transfer method in the method of transferring micro semiconductor chips according to an embodiment.
Figure 8:
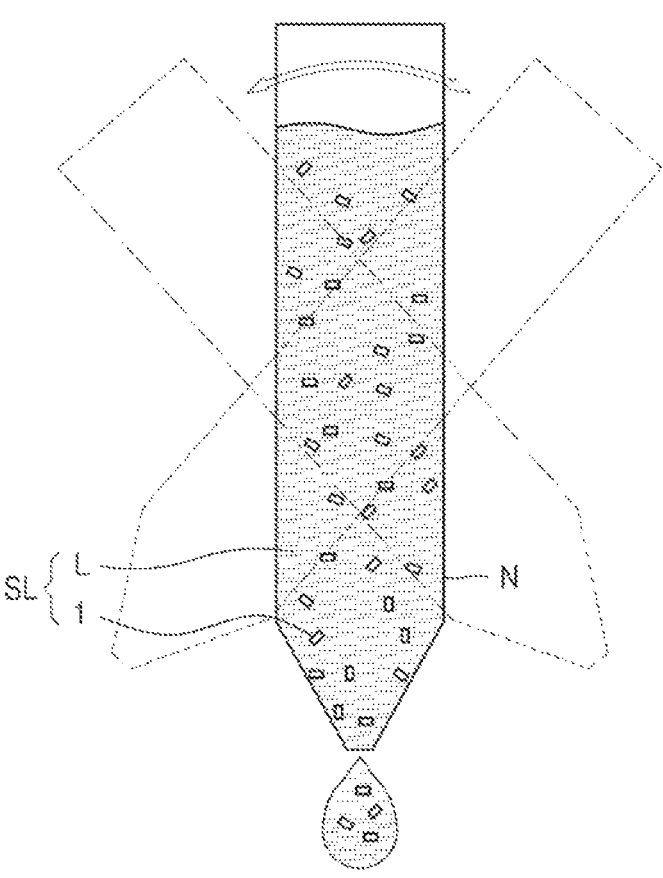
Figure 9:
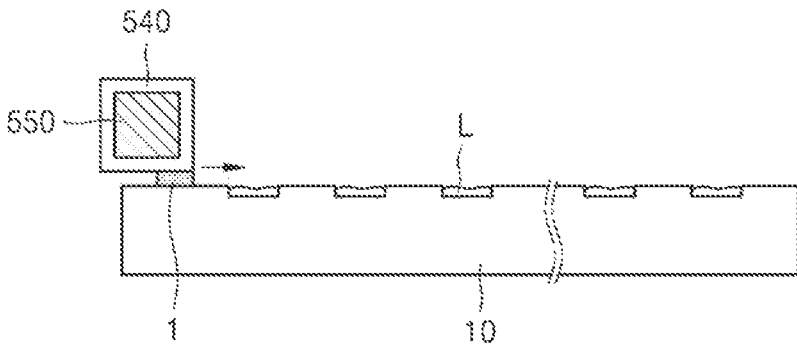

Referring to FIGS. 7 to 9, a liquid L may be supplied to the plurality of grooves 120 to supply and align the plurality of micro semiconductor chips 1. Any kind of liquid may be used as the liquid L as long as the liquid does not corrode or damage the micro semiconductor chips 1 or the first substrate 10. The liquid L may include at least one from among the group consisting of, for example, water, ethanol, alcohol, polyol, ketone, halocarbon, acetone, a flux, and an organic solvent. The organic solvents may include, for example, isopropyl alcohol (IPA). However, the liquid L is not limited thereto, and various changes may be made therein. Various methods may be used to supply the liquid L to the plurality of grooves 120, e.g., a spray method, a dispensing method, an inkjet dot method, a method of flowing the liquid to the first substrate 10, etc. Detailed descriptions thereof are given below.

The plurality of micro semiconductor chips 1 are supplied onto the first substrate 10. The micro semiconductor chips 1 may be micro light-emitting devices. However, the micro semiconductor chips 1 are not limited thereto and may be micro memory chips. The micro semiconductor chips 1 may include at least one of micro light-emitting devices and micro memory chips. The micro semiconductor chip 1 may include, for example, an N-type semiconductor layer, an active layer, and a P-type semiconductor layer. For example, the N-type semiconductor layer may be an N-type GaN layer, and the P-type semiconductor layer may be a P-type GaN layer. The active layer may have, for example, a quantum well structure or a multi-quantum well structure.

The micro semiconductor chip 1 may have a size of 200 μm or less. Here, the size may refer to the maximum diameter of the cross-section of the micro semiconductor chip 1. The cross-section may represent a cross-section perpendicular to a direction in which light is emitted from the micro semiconductor chip 1. The micro semiconductor chip 1 may have a cross-section of various shapes, such as a triangular cross-section, a rectangular cross-section, a circular cross-section, etc.

The preparation of the liquid L in which the plurality of micro semiconductor chips 1 are stirred may include forming a suspension SL by supplying the plurality of micro semiconductor chips 1 to the liquid L.

As shown in FIG. 8, before supplying the liquid L onto the first substrate 10, the suspension SL including the plurality of micro semiconductor chips 1 and the liquid L may be stirred. For example, a nozzle unit N containing the suspension SL may be shaken. Therefore, the plurality of micro semiconductor chips 1 included in the suspension SL may be evenly mixed.

In the supplying of the liquid L to the plurality of grooves 120, the plurality of micro semiconductor chips 1 may be directly sprayed onto the first substrate 10 without a liquid or may be supplied by using a material other than a liquid. Alternatively, the micro semiconductor chip 1 may be supplied onto the first substrate 10 in various ways in a state of being included in the suspension SL. In this case, the micro semiconductor chip 1 may be supplied by using various methods, e.g., a spray method, a dispensing method, an inkjet dot method, and a method of flowing the suspension SL onto the first substrate 10, etc. Methods of supplying the micro semiconductor chips 1 onto the first substrate 10 are not limited thereto, and various modifications may be made thereto. The liquid L may be supplied to exactly fill the plurality of grooves 120 or the liquid L may be supplied to overflow from the plurality of grooves 120. The supply amount of the liquid L may be variously adjusted.

In an operation of aligning the plurality of micro semiconductor chips 1 with the plurality of grooves 120 by scanning the first substrate 10 with an absorbing member 540 capable of absorbing the liquid L, when the liquid L and the micro semiconductor chips 1 are supplied onto the first substrate 10, the first substrate 10 is scanned by using the absorbing member 540 capable of absorbing the liquid L. The absorbing member 540 may include any material capable of absorbing the liquid L, and the shape or the structure thereof is not limited. The absorbing member 540 may include, for example, fabric, tissue, polyester fiber, paper, or a wiper. The absorbing member 540 may be used alone without other auxiliary devices. However, the present disclosure is not limited thereto, and the absorbing member 540 may be connected to a support 550 to facilitate scanning of the first substrate 10 by using the absorbing member 540. The support 550 may have various shapes and structures suitable for scanning the first substrate 10. The support 550 may include, for example, a rod, a blade, a plate, or a wiper. The absorbing member 540 may be provided on any one surface of the support 550, or the absorbing member 540 may have a shape wound around the support 550.

The absorbing member 540 may scan the first substrate 10 while pressing the first substrate 10 at an appropriate pressure. The scanning of the first substrate 10 may include bringing the absorbing member 540 into contact with the first substrate 10 and passing the absorbing member 540 over the plurality of grooves 120. The liquid L may be absorbed by the absorbing member 540 during scanning. The scanning may be performed in various ways including, for example, at least one of sliding, rotating, translationally moving, reciprocating, rolling, spinning, or rubbing of the absorbing member 540. The scanning may be performed regularly and/or irregularly. Alternatively, the scanning may include at least one of rotating, translationally moving, rolling, and spinning of the first substrate 10. Alternatively, the scanning may be performed by cooperation between the absorbing member 540 and the first substrate 10.

The scanning of the first substrate 10 using the absorbing member 540 may include absorbing the liquid L in the plurality of grooves 120 while the absorbing member 540 passes over the plurality of grooves 120. When the absorbing member 540 scans the first substrate 10, at least one micro semiconductor chip 1 may be attached to the absorbing member 540. Also, the absorbing member 540 may pass over the plurality of grooves 120 while contacting the first substrate 10.

After all of the micro semiconductor chips 1 are transferred to the first substrate 10, dummy microchips remaining on the first substrate 10 are removed.

Referring to FIG. 9, the absorbing member 540 is provided on a surface of the support 550, and scanning may be performed while the absorbing member 540 is in contact with a surface of the first substrate 10. When the absorbing member 540 is scanned, the micro semiconductor chips 1 may be adsorbed or attached to a surface of the absorbing member 540, and the micro semiconductor chips 1 may be pushed forward by the absorbing member 540. The micro semiconductor chips 1 may be positioned between the absorbing member 540 and the first substrate 10.

Figure 10:
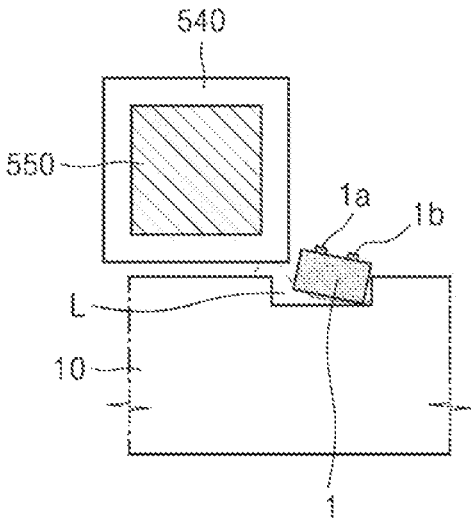

Referring to FIG. 10, the micro semiconductor chips 1 moved by the absorbing member 540 may enter the plurality of grooves 120. Here, the absorbing member 540 may absorb the liquid L in the plurality of grooves 120, and the micro semiconductor chips 1 may enter the plurality of grooves 120. The micro semiconductor chip 1 may have a horizontal electrode structure. Electrodes 1a and 1b of the micro semiconductor chip 1 may be hydrophobic. The electrodes 1a and 1b may be arranged to face the upper opening of a groove 120 by the interaction between (i) the electrodes 1a and 1b and (ii) the liquid L during the scanning. When the micro semiconductor chips 1 are seated in the plurality of grooves 120, the micro semiconductor chips 1 may be immersed in the liquid L.

The operations described above may be repeated as necessary until all of the micro semiconductor chips 1 are transferred to the first substrate 10. The liquid L is removed by the absorbing member 540 during alignment of the micro semiconductor chips 1, and the liquid L remaining after the alignment of the micro semiconductor chips 1 may be removed by a separate process.

When the electrodes 1a and 1b of the micro semiconductor chips 1 are arranged to face the bottom of the plurality of grooves 120, as the liquid L is absorbed by the scanning operation of the absorbing member 540 and the micro semiconductor chip 1 moves to the plurality of grooves 120, the electrodes 1a and 1b of the micro semiconductor chips 1 may be arranged to face the upper openings of the plurality of grooves 120.

As the liquid L is absorbed by the scanning operation of the absorbing member 540 and the micro semiconductor chips 1 move, the electrodes 1a of the micro semiconductor chips 1 may be arranged to face the upper openings of the plurality of grooves 120.

When the electrodes 1a and 1b of the micro semiconductor chips 1 are arranged to face downward, the liquid L is absorbed by the scanning operation of the absorbing member 540 and the micro semiconductor chips 1 move to the plurality of grooves 120, and thus, the electrodes 1a of the micro semiconductor chips 1 may be arranged to face the upper openings of the plurality of grooves 120 according to the flow of the liquid L. The electrodes 1a and 1b may be arranged to face the upper opening of a groove 120 by the interaction between the electrodes 1a and 1b and the liquid L during the scanning.

Figure 11:
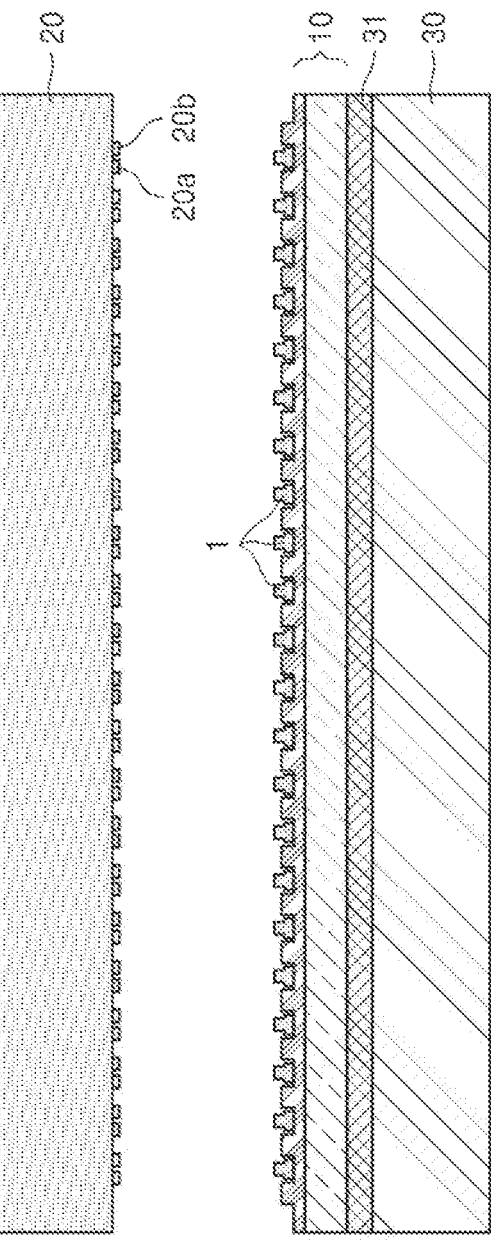
Figure 12:
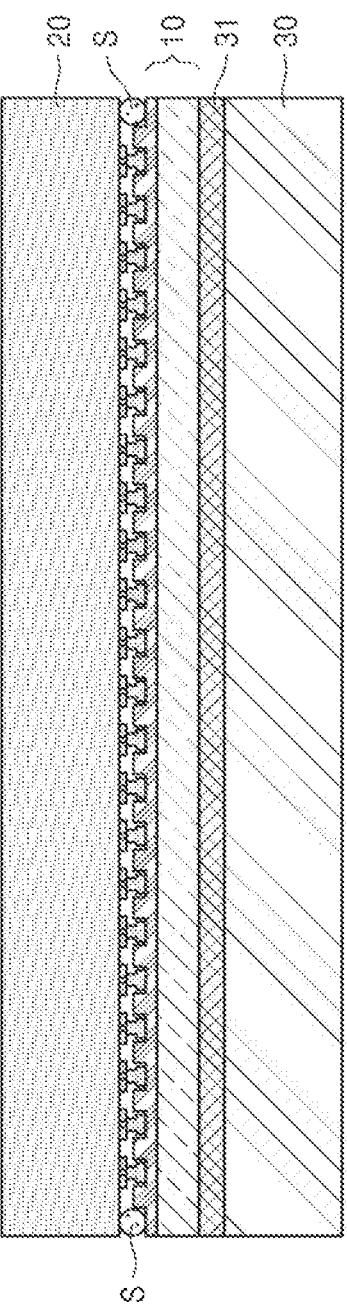
Figure 13:
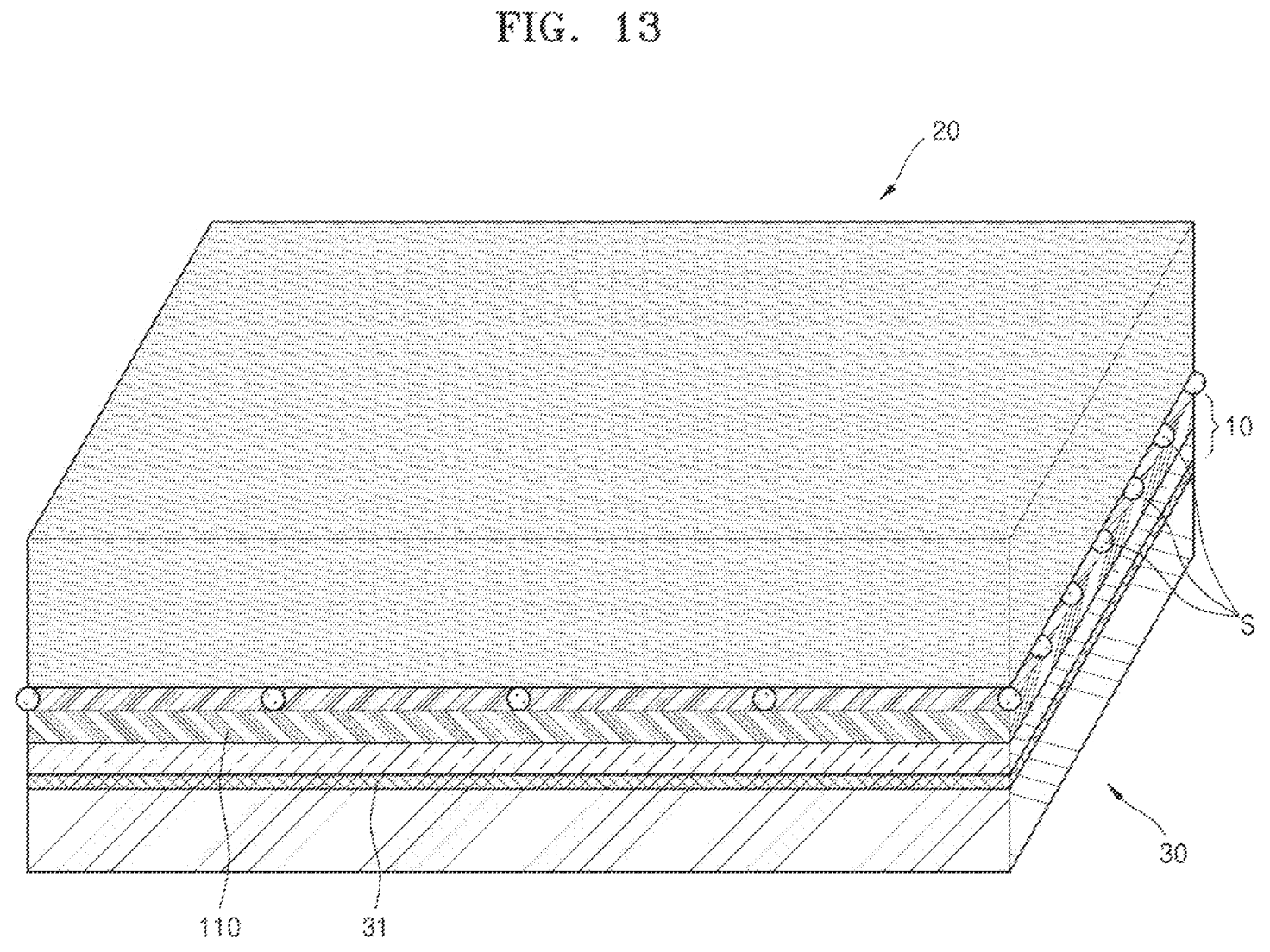
Figure 14:
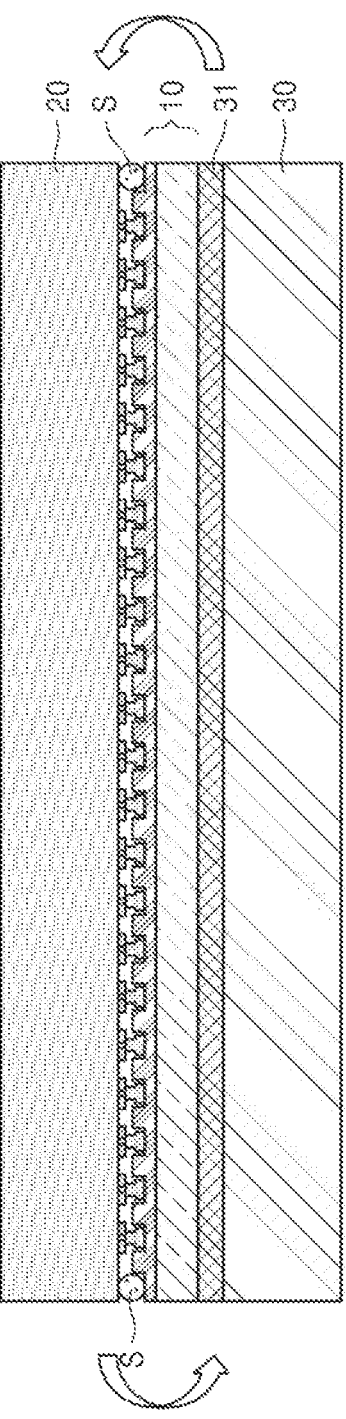

FIGS. 11 to 13 are diagrams for describing an operation of (partially) adhering a second substrate to a first substrate in the method of transferring the micro semiconductor chip 1 according to an embodiment.

Referring to FIGS. 1 and 11 to 13, in the method of transferring the micro semiconductor chip 1 according to an embodiment, a second substrate 20 may be partially adhered to the first substrate 10 on which the plurality of micro semiconductor chips 1 are aligned (operation S40).

To this end, for example, the second substrate 20 is disposed to face the first surface 11 of the first substrate 10. The second substrate 20 may be a driving circuit board. The second substrate 20 may be a substrate including a thin-film transistor. Electrodes 20a and 20b may be arranged on the second substrate 20. Referring to FIG. 11, the first substrate 10 and the second substrate 20 may be arranged, such that the electrodes 20a and 20b of the second substrate 20 and the electrodes 1a and 1b of the plurality of micro semiconductor chips 1 on the pattern layer 110 of the first substrate 10 face each other. To align the electrodes 20a and 20b of the second substrate 20 respectively with the electrodes 1a and 1b of the plurality of micro semiconductor chips 1, the position of at least one of the first substrate 10 and the second substrate 20 may be adjusted. For subsequent processes, the relative positions of the first substrate 10 and the second substrate 20 may be temporarily fixed. For example, the relative positions of the first substrate 10 and the second substrate 20 may be fixed to maintain adjusted positions of the first substrate 10 and the second substrate 20 in an operation of removing the support substrate 30 to be described below.

Referring to FIGS. 12 and 13, the first substrate 10 and the second substrate 20 may be 'partially' adhered to each other. For example, after a plurality of solder balls S are arranged between the first substrate 10 and the second substrate 20, the first substrate 10 and the second substrate 20 may be partially adhered to each other by bringing the first substrate 10 and the second substrate 20 close to each other.

The plurality of solder balls S may be partially arranged between the first substrate 10 and the second substrate 20. The plurality of solder balls S may be partially arranged on regions of the first surface 11 of the first substrate 10 in which the plurality of grooves 120 are not arranged. For example, the plurality of solder balls S may be partially arranged in edge regions between the first substrate 10 and the second substrate 20. However, the number, the size, the position, and the distance of the solder balls S shown in FIG. 12 are just examples, and various modifications obvious to one of ordinary skill in the art may be made therein. For example, the solder balls S may be arranged at various positions between the first substrate 10 and the second substrate 20 at which the plurality of micro semiconductor chips 1 are not arranged even in regions other than the edge regions of the first substrate 10 and the second substrate 20.

The solder balls S for partial adhesion may be removed in a subsequent operation. Therefore, the solder balls S may serve as a temporary adhesive for temporarily maintaining the positions of the first substrate 10 and the second substrate 20. As long as the solder balls S are capable of serving as a temporary adhesive, various modifications may be made thereto. For example, a polymeric adhesive, such as benzo-cyclobutene, polymethyl methacrylate, or Polyimide (PI), may be used by using a micro-dispenser or an inkjet method. Furthermore, adhesives for temporary adhesion having adhesive strength that is weakened under certain conditions (temperature change, UV irradiation, etc.) may be used. When an adhesive is applied as droplets, it may be applied in an array-like shape to edge regions of the first substrate 10 and the second substrate 20 or may be applied to portions of the first substrate 10 and the second substrate 20.

FIGS. 14 to 17 are diagrams for describing an operation of separating the support substrate 30 from the first substrate 10 in the method of transferring the micro semiconductor chip 1 according to an embodiment.

Referring to FIGS. 1 and 14 to 17, in the method of transferring the micro semiconductor chip 1 according to an embodiment, the support substrate 30 may be separated from the first substrate 10 while the relative positions of the first substrate 10 and the second substrate 20 are maintained (operation S50). To this end, for example, referring to FIG. 14, an assembly in which the first substrate 10, the second substrate 20, and the support substrate 30 are connected to one another may be turned upside down. The assembly may be turned upside down such that the support substrate 30 faces upward. It may be easy to separate the support substrate 30 after the support substrate 30 from the first substrate 10 after the support substrate 30 faces upward.

Figure 15:
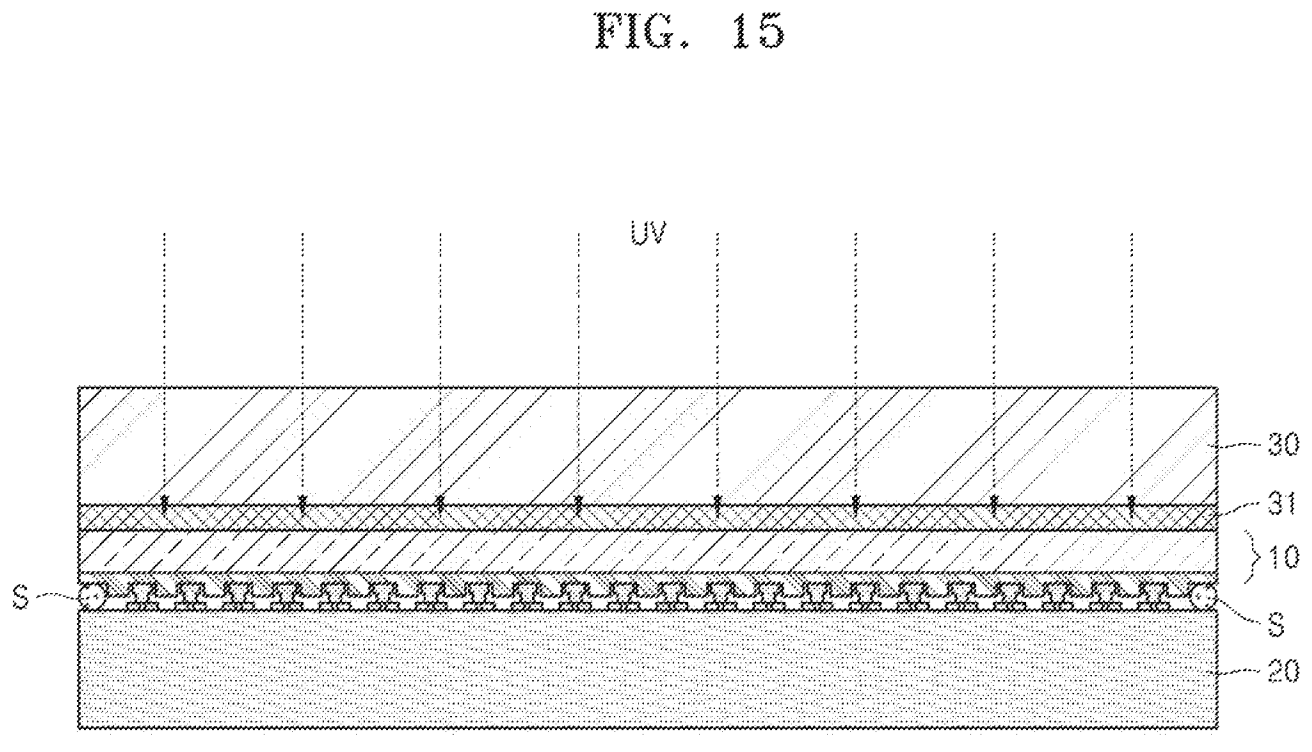

Referring to FIG. 15, the adhesive strength of the adhesive layer 31 between the support substrate 30 and the first substrate 10 may be weakened. For example, the adhesive strength of the adhesive layer 31 may be weakened or the adhesive layer 31 may be removed by irradiating a laser beam to the adhesive layer 31 through the support substrate 30 from above. The support substrate 30 may include a material via which a laser beam transmits therethrough. The laser beam may be a UV ray wavelength laser beam. A certain temperature may be set while a laser beam is being irradiated or before/after the laser beam is irradiated to the adhesive layer 31.

Figure 16:
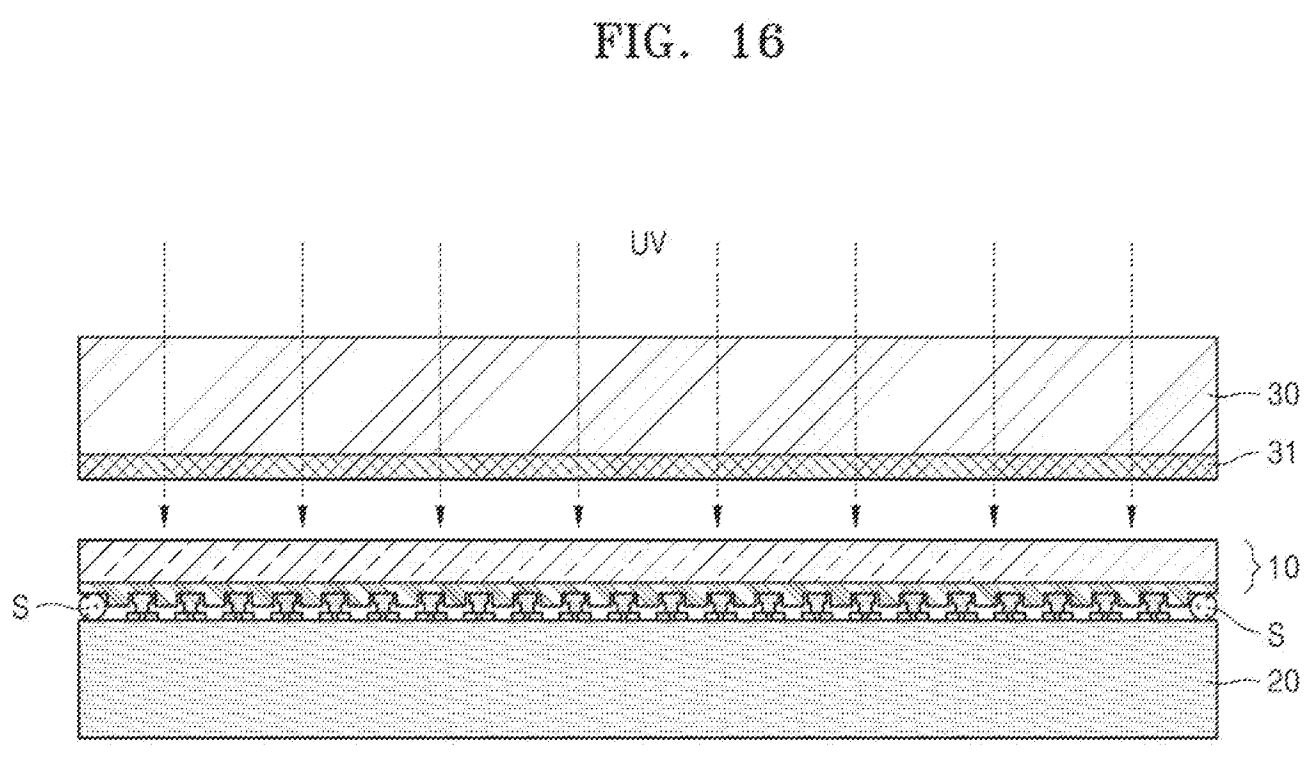

Referring to FIG. 16, the support substrate 30 is separated from the first substrate 10 when the adhesive strength of the adhesive layer 31 is weakened. The support substrate 30 once separated may be post-processed and stored in a separate place to be attached to the second surface 12 of another first substrate 10.

Although the support substrate 30 is separated, the second substrate 20 is still attached to the first substrate 10, and thus, the first substrate 10 may maintain the shape thereof. Therefore, a certain distance between the plurality of micro semiconductor chips 1 arranged on the first substrate 10 may be maintained.

Figure 17:
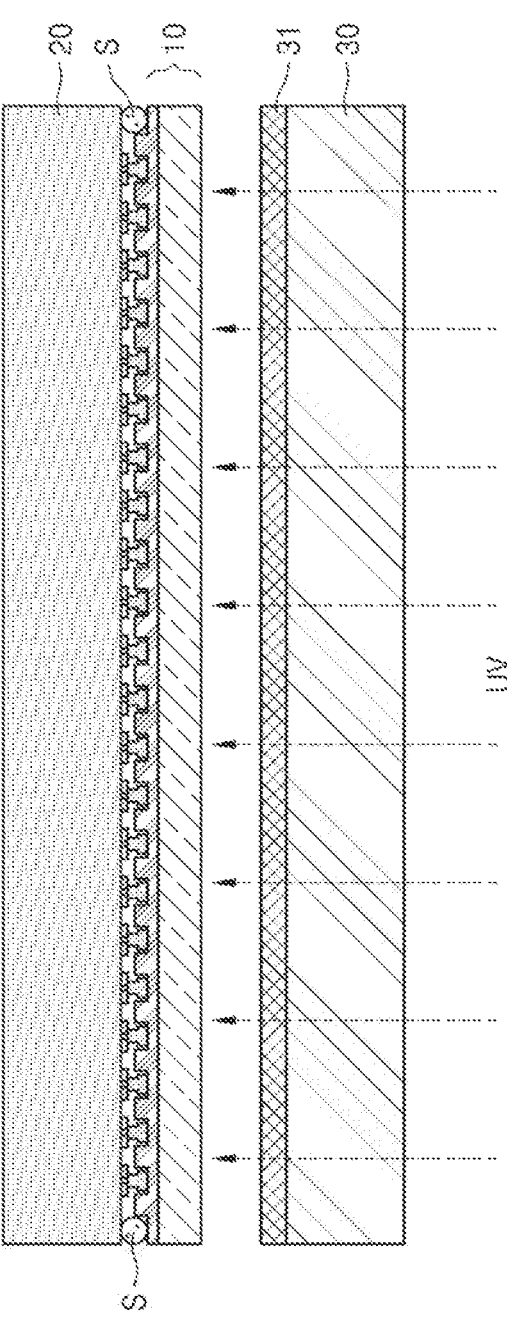

In the embodiment described above, descriptions are mainly of an example including an operation of turning an assembly upside down before separating a support substrate. However, the method of transferring a micro semiconductor chip, according to an embodiment, does not necessarily include an operation of turning an assembly upside down, and the operation may be omitted as needed. For example, as shown in FIG. 17, the support substrate 30 may be separated from the first substrate 10 after the adhesive strength of the adhesive layer 31 is weakened by irradiating a laser beam to the adhesive layer 31 from below.

In ideal conditions and environments, sizes, heights, and shapes of a first substrate provided with a plurality of grooves and a plurality of micro semiconductor chips inserted into the plurality of grooves may be uniform. However, in realistic conditions and environments, the height of the plurality of micro semiconductor chips and the depth of the plurality of grooves may not be uniform due to various factors.

Figure 18:
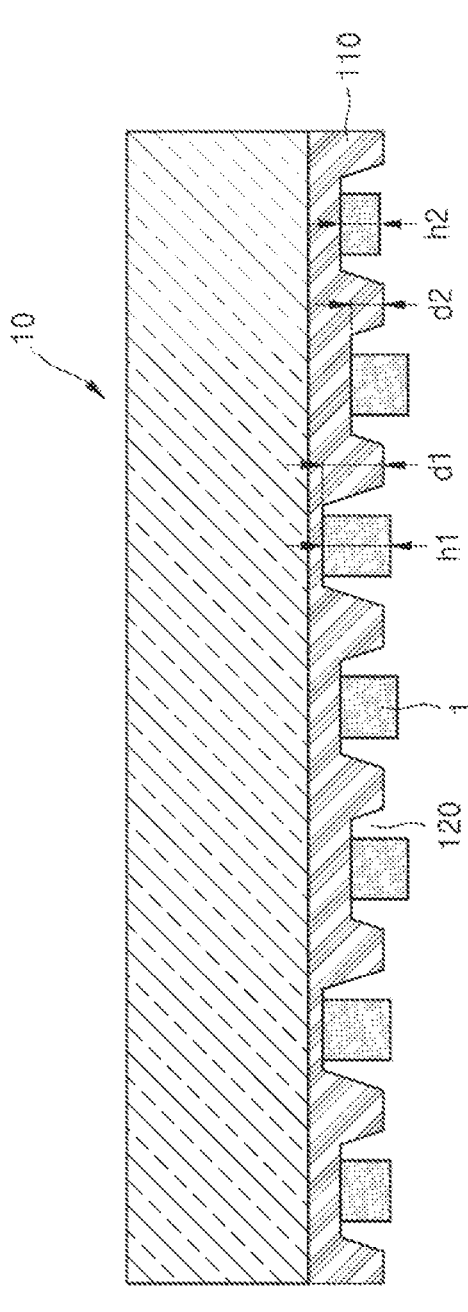
FIG. 18 illustrates a cross-section of a first substrate that may be used in the method of transferring micro semiconductor chips according to an embodiment.

FIG. 18 illustrates a cross-section of the first substrate 10 used in the method of transferring the micro semiconductor chip 1 according to an embodiment. Referring to FIG. 18, the size and the shape of the plurality of micro semiconductor chips 1 and the depth of the plurality of grooves 120 may also not be uniform. For example, the size and the shape of the plurality of micro semiconductor chips 1 may not be uniform due to tolerances in a process of manufacturing the same. For example, a height h2 of some of the plurality of micro semiconductor chips 1 may be different from a height h1 of the remaining micro semiconductor chips 1. A depth d2 of some of the plurality of grooves 120 may be different from a depth d1 of the remaining ones of the plurality of grooves 120. Some of the plurality of grooves 120 formed in the first substrate 10 may have different depths d1 and d2, and some of the plurality of micro semiconductor chips 1 arranged in the plurality of grooves 120 may have different heights h1 and h2.

Therefore, when the first substrate 10 on which the plurality of micro semiconductor chips 1 having irregular shapes are arranged contacts with the second substrate 20, some of the plurality of micro semiconductor chips 1 arranged on the first substrate 10 may not contact the second substrate 20.

Figure 19:
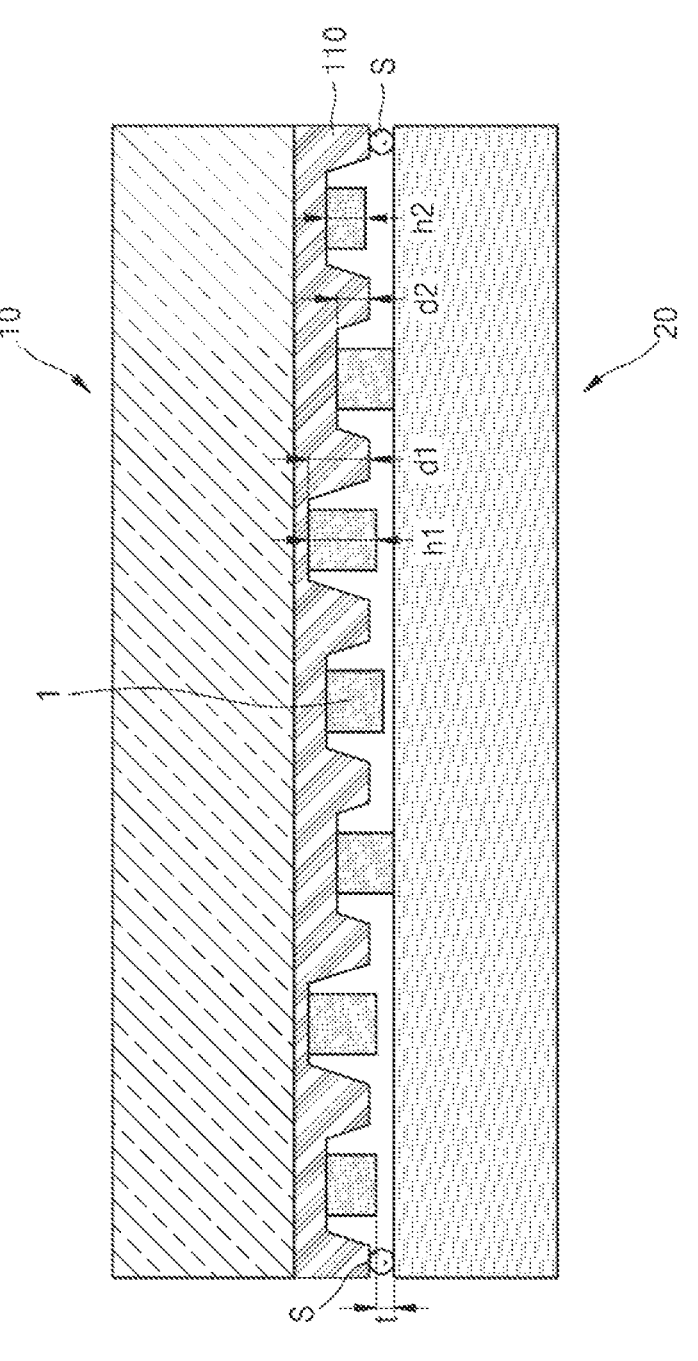
FIG. 19 illustrates a state in which some of a plurality of micro semiconductor chips positioned on a pattern layer are in contact with a second substrate in the method of transferring micro semiconductor chips according to an embodiment.

FIG. 19 illustrates a state in which some of the plurality of micro semiconductor chips 1 positioned on the pattern layer 110 are in contact with the second substrate 20 in the method of transferring a micro semiconductor chip according to an embodiment.

Referring to FIG. 19, when the plurality of micro semiconductor chips 1 have different heights h1 and h2 from the second surface 12 of the first substrate 10, some of the plurality of micro semiconductor chips 1 may not contact the second substrate 20.

In the operation described above of partially adhering the second substrate 20 to the first substrate 10, as the first substrate 10 and the second substrate 20 come closer to each other, the micro semiconductor chips 1 having the relatively large height h1 may contact the second substrate 20 before the micro semiconductor chips 1 having the relatively small height h2. The micro semiconductor chip 1 having the relatively large height h1 may more likely contact the second substrate 20 as compared to the micro semiconductor chip 1 having the relatively small height h2. The micro semiconductor chips 1 positioned in the grooves 120 having the relatively large depth d1 from among the plurality of grooves 120 may less likely contact the second substrate 20 as compared to the micro semiconductor chips 1 positioned in the grooves 120 having the relatively small depth d2 from among the plurality of grooves 120. Before operation S60 of supplying a fluid to adhere the plurality of micro semiconductor chips 1 to the second substrate 20, an individual micro semiconductor chip 1 may or may not contact the second substrate 20 according to a height h of the individual micro semiconductor chip 1 and a depth d of the groove 120 corresponding to the individual micro semiconductor chip 1. As described above, there may be micro semiconductor chips 1 that do not contact the second substrate 20 due to the limitation of the physical shapes thereof. When the plurality of micro semiconductor chips 1 are electrically connected to the second substrate 20 by contacting the second substrate 20, some of the plurality of the micro semiconductor chips 1 may not contact the second substrate 20 and not be electrically connected to the second substrate 20.

In consideration of the case where some of the plurality of micro semiconductor chips 1 fail to contact the second substrate 20 as described above, the method of transferring micro semiconductor chips, according to an embodiment, may further include adhering the plurality of micro semiconductor chips 1 to the second substrate 20 by supplying a fluid into a chamber 40.

Figure 20:
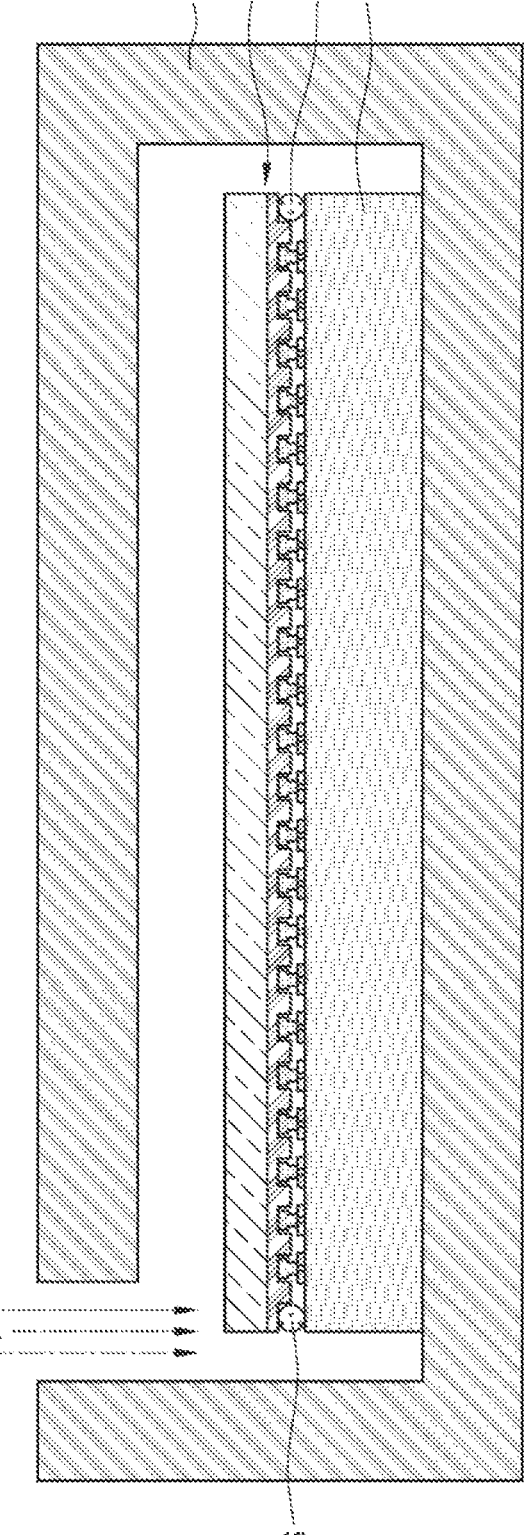
FIG. 20 illustrates an operation of adhering a plurality of micro semiconductor chips to a second substrate in the method of transferring micro semiconductor chips according to an embodiment.

FIG. 20 illustrates an operation of adhering the plurality of micro semiconductor chips 1 to the second substrate 20 in the method of transferring micro semiconductor chips according to an embodiment.

Referring to FIGS. 1 and 20, in the method of transferring micro semiconductor chips 1 according to an embodiment, a fluid may be supplied into the chamber 40 to adhere the plurality of micro semiconductor chips 1 to the second substrate 20 (operation S60). For example, applying a certain pressure to the second surface 12 of the first substrate 10 by supplying a fluid to the periphery of the second surface 12, the plurality of micro semiconductor chips 1 may be attached to the second substrate 20.

To this end, for example, the first substrate 10 and the second substrate 20 that are temporarily adhered to each other by the plurality of solder balls S are disposed in a chamber 40. The plurality of micro semiconductor chips 1 are respectively arranged in the plurality of grooves 120. In this state, a pressure P is applied to the second surface 12 of the first substrate 10 by supplying a fluid into the chamber 40.

Figure 21:
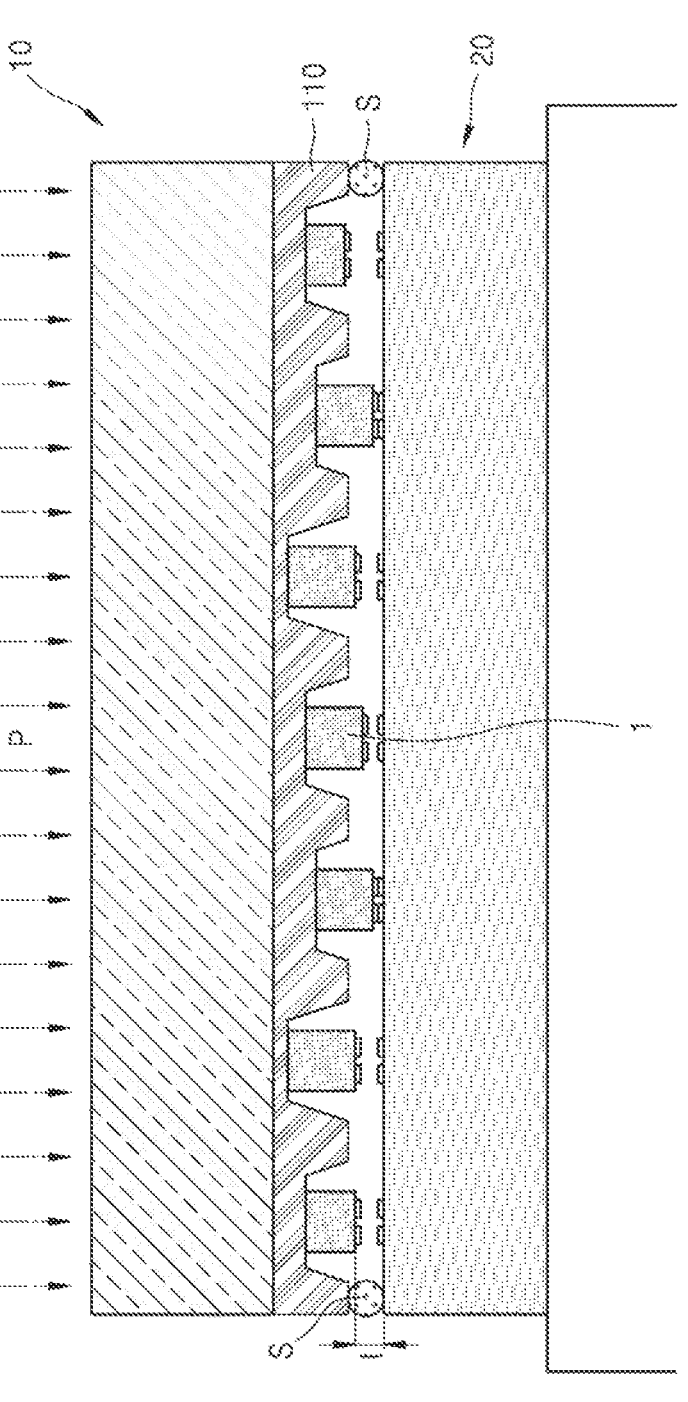
FIG. 21 illustrates a state before a certain pressure is applied to a second surface of a first substrate in the method of transferring micro semiconductor chips according to an embodiment.
Figure 22:
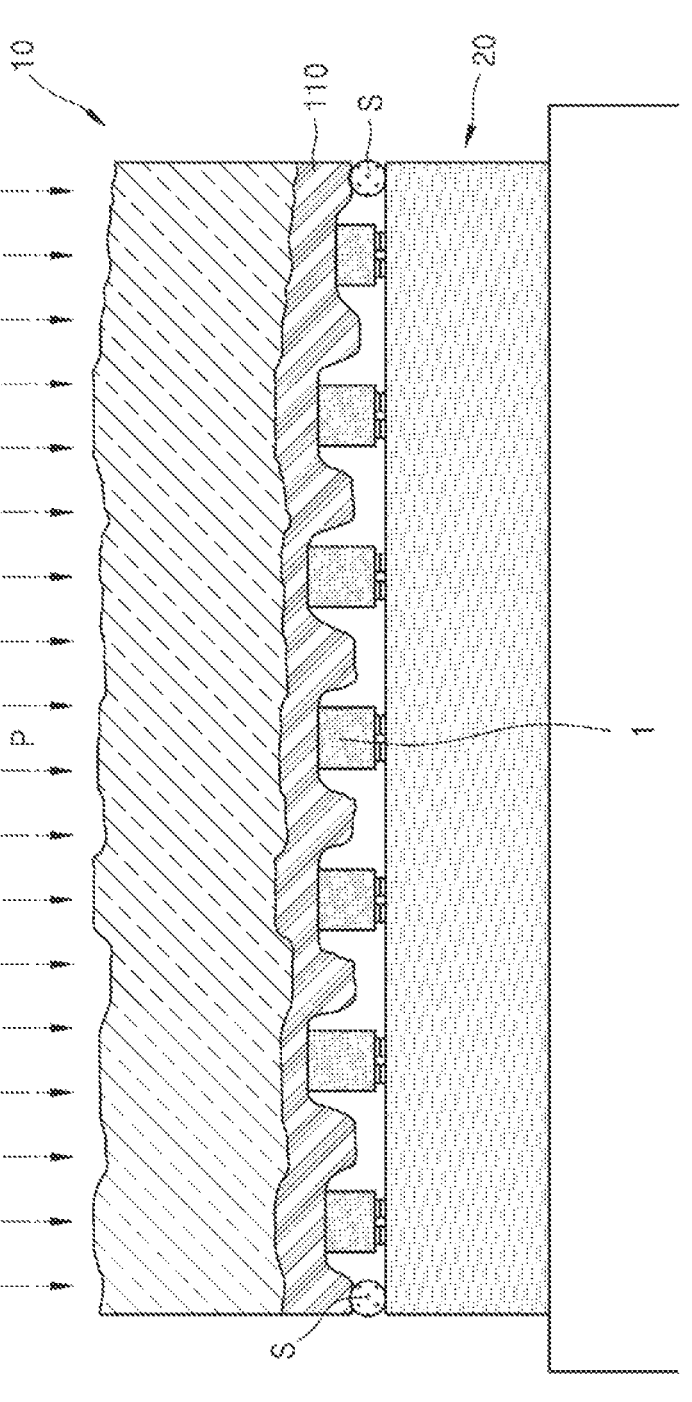
FIG. 22 is a diagram showing a state in which, as the certain pressure is applied to the second surface of the first substrate, all of a plurality of micro semiconductor chips contact the second substrate, in the method of transferring micro semiconductor chips according to an embodiment.

FIG. 21 illustrates a state before the certain pressure P is applied to the second surface 12 of the first substrate 10 in the method of transferring micro semiconductor chips according to an embodiment, and FIG. 22 is a diagram showing a state in which, as the certain pressure P is applied to the second surface 12 of the first substrate 10, all of the plurality of micro semiconductor chips 1 contact the second substrate 20, in the method of transferring micro semiconductor chips. The certain pressure P may be uniform pressure P Referring to FIG. 21, the certain pressure P may be applied to the second surface 12 of the first substrate 10 by a supplied fluid. The certain pressure P may be uniform pressure P. The uniform pressure P may be applied to the second surface 12 of the first substrate 10. The uniform pressure P may be applied to each of the plurality of micro semiconductor chips by the first surface 11 of the first substrate 10.

Referring to FIG. 22, when uniform pressure is applied to the second surface 12 of the first substrate 10, regions of the first substrate 10, in which the plurality of micro semiconductor chips 1 contact the second substrate 20, are not deformed, but regions of the first substrate 10, in which the plurality of micro semiconductor chips 1 do not contact the second substrate 20, are deformed. Therefore, the plurality of micro semiconductor chips 1 that did not contact the second substrate 20 (for example, as illustrated in FIG. 19) come into contact with the second substrate 20. When the first substrate 10 includes a flexible material, the first substrate 10 may be deformed by the pressure applied to the second surface 12. The deformed shape of the first substrate 10 may vary depending on shapes and heights of the individual micro semiconductor chip 1 and shapes and depths of the plurality of grooves 120.

When the electrodes 1a and 1b of all of the plurality of micro semiconductor chips 1 and all of the electrodes 20a and 20b of the second substrate 20 contact each other, all of the plurality of micro semiconductor chips 1 and the second substrate 20 may be electrically connected to each other.

The adhesion of the plurality of micro semiconductor chips 1 to the second substrate 20 may further include heating the plurality of micro semiconductor chips 1. For example, a certain temperature may be set in a direction toward the first substrate 10 or the second substrate 20 while applying pressure to the second surface 12 of the first substrate 10 or before/after the pressure is applied to the second surface 12 of the first substrate 10 by supplying a fluid into the chamber 40. The plurality of micro semiconductor chips 1 may be adhered to the second substrate 20. The fluid may be a liquid or a gas. The fluid may be air and may include nitrogen or argon.

Here, application of a certain temperature may mean heating electrodes of the plurality of micro semiconductor chips 1 and electrodes of the second substrate 20 to a temperature for soldering or eutectic bonding to be adhered to each other. For example, at least a part of an operation of adhering the plurality of micro semiconductor chips 1 to the second substrate 20 may be performed at a temperature within a range from about 180° C. to about 300° C.

Figure 23:
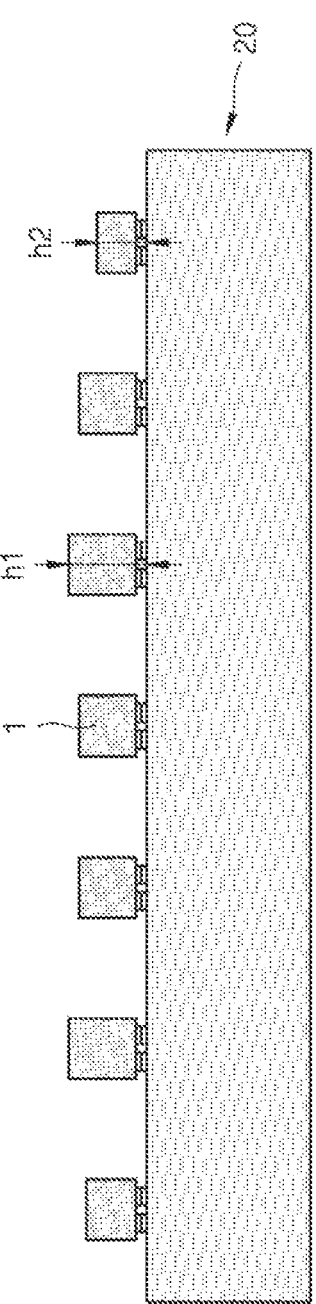
FIG. 23 illustrates a state in which a first substrate is removed.

FIG. 23 illustrates the second substrate 20 from which the first substrate 10 is separated. Referring to FIG. 23, after the operation of adhering the plurality of the micro semiconductor chips 1 is completed, the first substrate 10 may be removed from the second substrate 20 and the plurality of micro semiconductor chips 1 attached onto the second substrate 20.

To this end, for example, temporary adhesion between the first substrate 10 and the second substrate 20 by the solder balls S may be released. For example, the solder balls S temporarily fixing the first substrate 10 and the second substrate 20 may be removed. Traces of adhesion of solder balls S temporarily fixing the first substrate 10 and the second substrate 20 may remain on the second substrate 20.

The height h2 of at least some of the plurality of micro semiconductor chips 1 transferred to the second substrate 20 may be different from the height h1 of the remaining micro semiconductor chips 1. A structure in which the plurality of micro semiconductor chips 1 are transferred to the second substrate 20 may be a display device.

Figure 24:
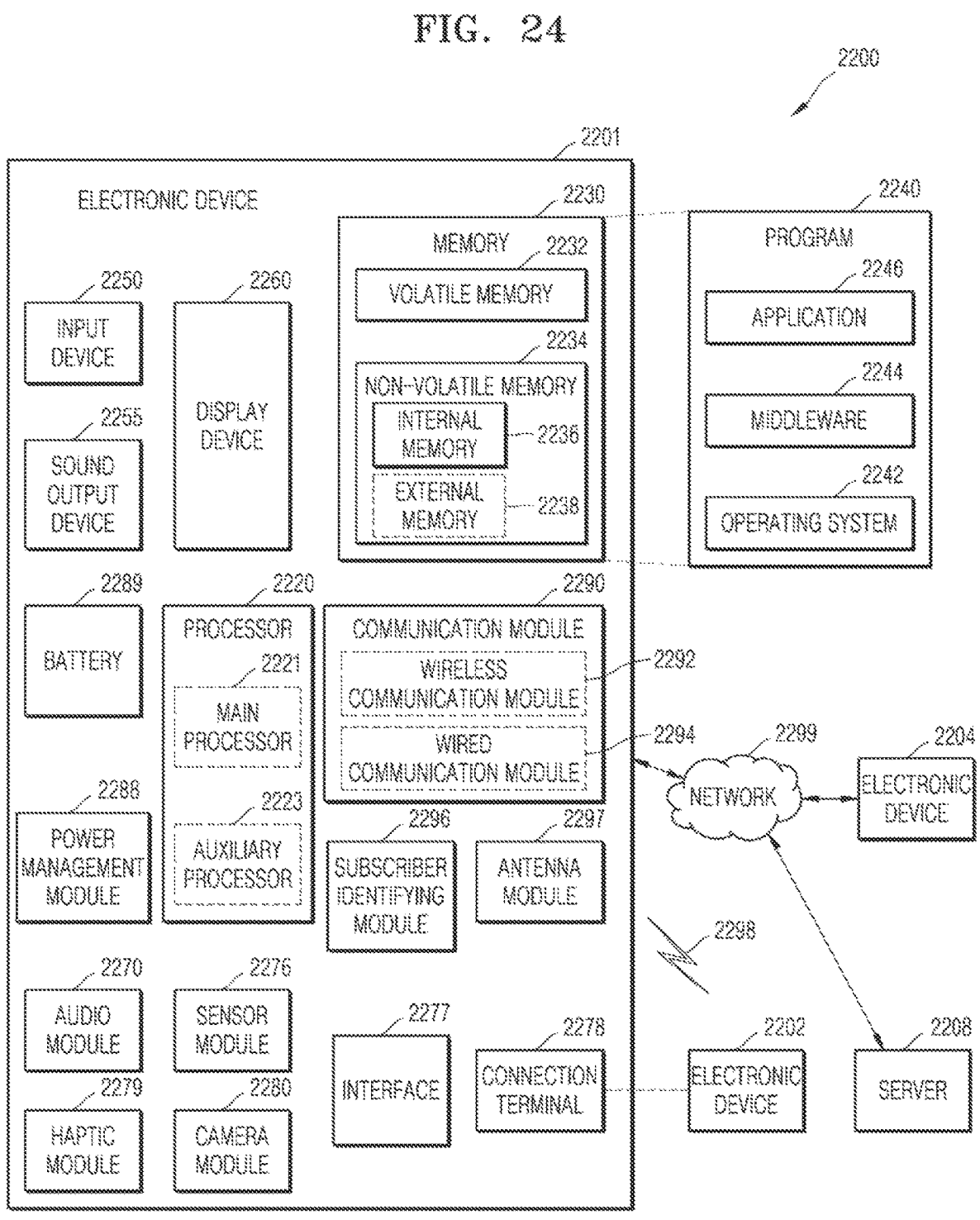
FIG. 24 illustrates an electronic device including a display device according to an embodiment.

FIG. 24 illustrates an electronic device 2201 including a display device according to an embodiment. Referring to FIG. 24, the electronic device 2201 may be provided in a network environment 2200. In the network environment 2200, the electronic device 2201 may communicate with another electronic device 2202 through a first network 2298 (a short-range wireless communication network, etc.) or may communicate with another electronic device 2204 and/or a server 2208 through a second network 2299 (a long-distance wireless communication network, etc.). The electronic device 2201 may communicate with the electronic device 2204 through the server 2208. The electronic device 2201 may include a processor 2220, a memory 2230, an input device 2250, a sound output device 2255, a display device 2260, an audio module 2270, a sensor module 2276, an interface 2277, a haptic module 2279, a camera module 2280, a power management module 2288, a battery 2289, a communication module 2290, a subscriber identifying module 2296, and/or an antenna module 2297. In the electronic device 2201, some of these components may be omitted or other components may be added. Some of these components may be implemented as one integrated circuit. For example, the sensor module 2276 (e.g., a fingerprint sensor, an iris sensor, and an illuminance sensor) may be implemented by being embedded in the display device 2260 (e.g., a display).

The processor 2220 may execute software (e.g., a program 2240) to control one or a plurality of other components (hardware components, software components, etc.) of the electronic device 2201 connected to the processor 2220 or perform various pieces of data processing or operations. As a part of data processing or operations, the processor 2220 may load commands and/or data received from other components (e.g., the sensor module 2276 and the communication module 2290) into a volatile memory 2232, process commands and/or data stored in the volatile memory 2232, and store result data in a non-volatile memory 2234. The processor 2220 includes a main processor 2221 (e.g., a central processing unit and an application processor) and an auxiliary processor 2223 (e.g., a graphics processing unit, an image signal processor, a sensor hub processor, and a communication processor) that may be operated independently or together with the main processor 2221. The auxiliary processor 2223 may use less power than the main processor 2221 and may perform a specialized function.

The auxiliary processor 2223 may control functions and/or states related to some components (e.g., the display device 2260, the sensor module 2276, and the communication module 2290) of the electronic device 2201 in place of the main processor 2221 while the main processor 2221 is in an inactive state (sleep state) or together with the main processor 2221 while the main processor 2221 is in an active state (application executing state). The auxiliary processor 2223 (e.g., an image signal processor and a communication processor) may be implemented as a part of other functionally related components (e.g., the camera module 2280 and the communication module 2290).

The memory 2230 may store various pieces of data needed by components (e.g., the processor 2220 and the sensor module 2276) of the electronic device 2201. Data may include, for example, input data and/or output data for software (e.g., the program 2240) and instructions related thereto. The memory 2230 may include the volatile memory 2232 and/or the non-volatile memory 2234.

The program 2240 may be stored as software in the memory 2230 and may include an operating system 2242, middleware 2244, and/or an application 2246.

The input device 2250 may receive a command and/or data to be used by a component (e.g., the processor 2220) of the electronic device 2201 from outside the electronic device 2201 (e.g., a user). The input device 2250 may include a remote controller, a microphone, a mouse, a keyboard, and/or a digital pen (e.g., a stylus pen).

The sound output device 2255 may output a sound signal to the outside of the electronic device 2201. The sound output device 2255 may include a speaker and/or a receiver. The speaker may be used for general purposes like multimedia playback or recording playback, and the receiver may be used to receive an incoming call. The receiver may be integrated as a part of the speaker or may be implemented as an independent separate device.

The display device 2260 may visually provide information to the outside of the electronic device 2201. The display device 2260 may include a display, a hologram device, or a projector and a control circuit for controlling the corresponding device. The display device 2260 is manufactured according to the method described above with reference to FIGS. 1 to 21, and the display device 2260 may include a display transfer structure. The display device 2260 may include a touch circuit configured to sense a touch and/or sensor circuitry configured to measure the intensity of force generated by a touch (e.g., a pressure sensor).

The audio module 2270 may convert sound into an electric signal or convert an electric signal into sound. The audio module 2270 may obtain sound through the input device 2250 or output sound through the sound output device 2255 and/or a speaker and/or headphones of another electronic device (e.g., an electronic device 2202) directly or wirelessly connected to the electronic device 2201.

The sensor module 2276 may detect an operating state (e.g., power and a temperature) of the electronic device 2201 or an ambient environmental state (e.g., a user state) and generate an electrical signal and/or a data value corresponding to a sensed state. The sensor module 2276 may include a gesture sensor, a gyro sensor, an atmospheric pressure sensor, a magnetic sensor, an acceleration sensor, a grip sensor, a proximity sensor, a color sensor, an infrared ray (IR) sensor, a biometric sensor, a temperature sensor, a humidity sensor, and/or an illuminance sensor.

The interface 2277 may support one or more designated protocols that may be used to directly or wirelessly connect the electronic device 2201 to another electronic device (e.g., the electronic device 2202). The interface 2277 may include a high definition multimedia interface (HDMI), a universal serial bus (USB) interface, an SD card interface, and/or an audio interface.

A connection terminal 2278 may include a connector through which the electronic device 2201 may be physically connected to another electronic device (e.g., the electronic device 2202). The connection terminal 2278 may include an HDMI connector, a USB connector, an SD card connector, and/or an audio connector (e.g., a headphone connector).

The haptic module 2279 may convert an electrical signal into a mechanical stimulus (e.g., vibration and movement) or an electrical stimulus that the user may perceive through tactile or kinesthetic sense. The haptic module 2279 may include a motor, a piezoelectric element, and/or an electrical stimulation device.

The camera module 2280 may capture still images and moving pictures. The camera module 2280 may include a lens assembly including one or more lenses, image sensors, image signal processors, and/or flashes. The lens assembly included in the camera module 2280 may collect light emitted from an object, which is a target of capturing an image.

The power management module 2288 may manage power supplied to the electronic device 2201. The power management module 2288 may be implemented as a part of a power management integrated circuit (PMIC).

The battery 2289 may supply power to components of the electronic device 2201. The battery 2289 may include a non-rechargeable primary cell, a rechargeable secondary cell, and/or a fuel cell.

The communication module 2290 may establish a direct (wired) communication channel and/or a wireless communication channel between the electronic device 2201 and other electronic devices (e.g., the electronic device 2202, the electronic device 2204, and the server 2208) and support communication through an established communication channel. The communication module 2290 may include one or more communication processors that operate independently of the processor 2220 (e.g., an application processor) and support direct communication and/or wireless communication. The communication module 2290 may include a wireless communication module 2292 (e.g., a cellular communication module, a short-range wireless communication module, and a global navigation satellite system (GNSS) communication module) and/or a wired communication module 2294 (e.g., a local area network (LAN) communication module and a power line communication module). From among these communication modules, a corresponding communication module may communicate with another electronic device through the first network 2298 (a short-range communication network like Bluetooth, Wi-Fi Direct, or infrared data association (IrDA)) or the second network 2299 (e.g., a cellular network, the Internet, or a computer network (e.g., LAN and WAN)). These various types of communication modules may be integrated into one component (e.g., a single chip) or implemented as a plurality of components (a plurality of chips) separate from one another. The wireless communication module 2292 may confirm and authenticate the electronic device 2201 in a communication network like the first network 2298 and/or the second network 2299 by using subscriber information (e.g., international mobile subscriber identifier (IMSI)) stored in the subscriber identifying module 2296.

The antenna module 2297 may transmit or receive signals and/or power to or from the outside (e.g., other electronic devices). An antenna may include a radiator having a conductive pattern formed on a substrate (e.g., a PCB). The antenna module 2297 may include one or a plurality of antennas. When the antenna module 2297 includes a plurality of antennas, an antenna suitable for a communication method used in a communication network like the first network 2298 and/or the second network 2299 may be selected from among the plurality of antennas by the communication module 2290. Signals and/or power may be transmitted or received between the communication module 2290 and another electronic device through a selected antenna. In addition to an antenna, other components (e.g., an RFIC) may be included as a part of the antenna module 2297.

Some of components may be connected to one another and exchange signals (e.g., commands and data) with one another through methods for communication between peripheral devices (e.g., a bus, general purpose input and output (GPIO), serial peripheral interface (SPI), and mobile industry processor interface (MIPI)).

Commands or data may be transmitted or received between the electronic device 2201 and the external electronic device 2204 through the server 2208 connected to the second network 2299. The other electronic devices 2202 and 2204 may be electronic devices of the type same as or different from that of the electronic device 2201. All or some of operations performed by the electronic device 2201 may be executed by one or more electronic devices from among the other electronic devices 2202 and 2204. For example, when the electronic device 2201 needs to perform a function or a service, the electronic device 2201 may request one or more other electronic devices to perform a part or all of the function or the service instead of executing the function or the service by itself. One or more other electronic devices that received the request may execute an additional function or a service related to the request and transmit a result of the execution to the electronic device 2201. To this end, cloud computing, distributed computing, and/or client-server computing technologies may be used.

Figure 25:
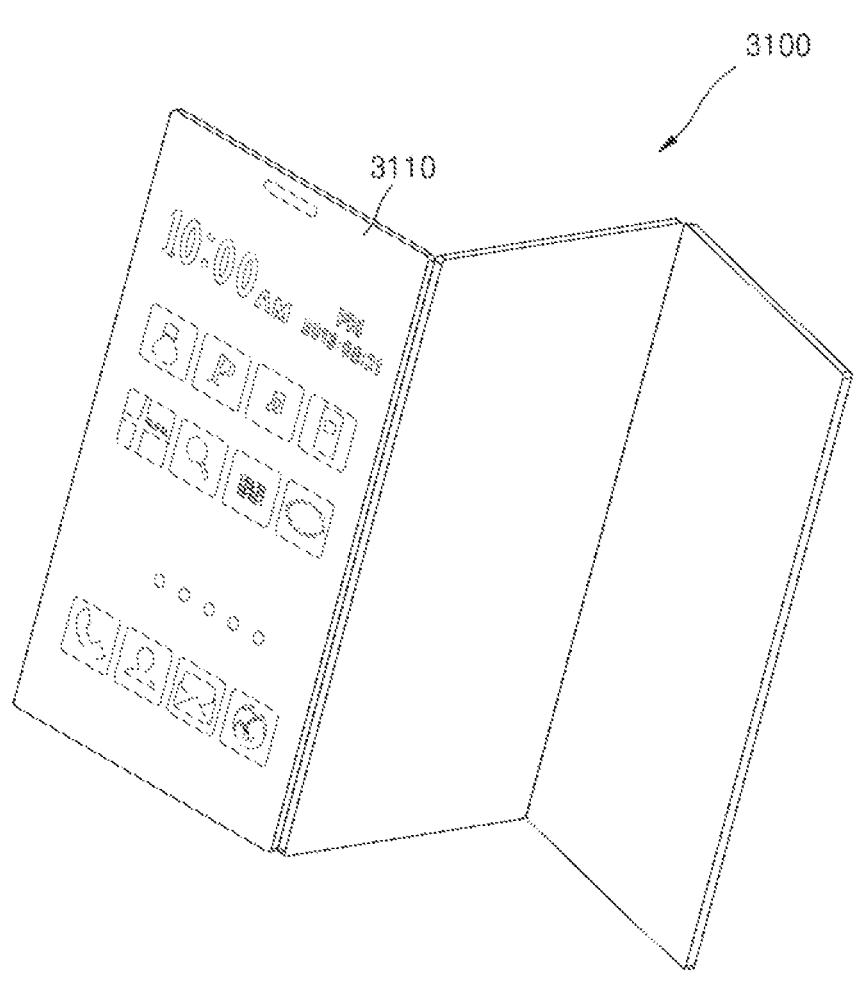
FIG. 25 illustrates an example in which an electronic device according to an embodiment is applied to a mobile device.

FIG. 25 illustrates an example in which an electronic device according to an embodiment is applied to a mobile device. A mobile device 3100 may include a display device 3110 according to an embodiment. The display device 3110 may include a display transfer structure. The display device 3110 may have a foldable structure, and may be applied to, for example, a multi-fold display. Here, although the mobile device is shown as a foldable display device, the present disclosure may also be applicable to a general flat panel display device.

Figure 26:
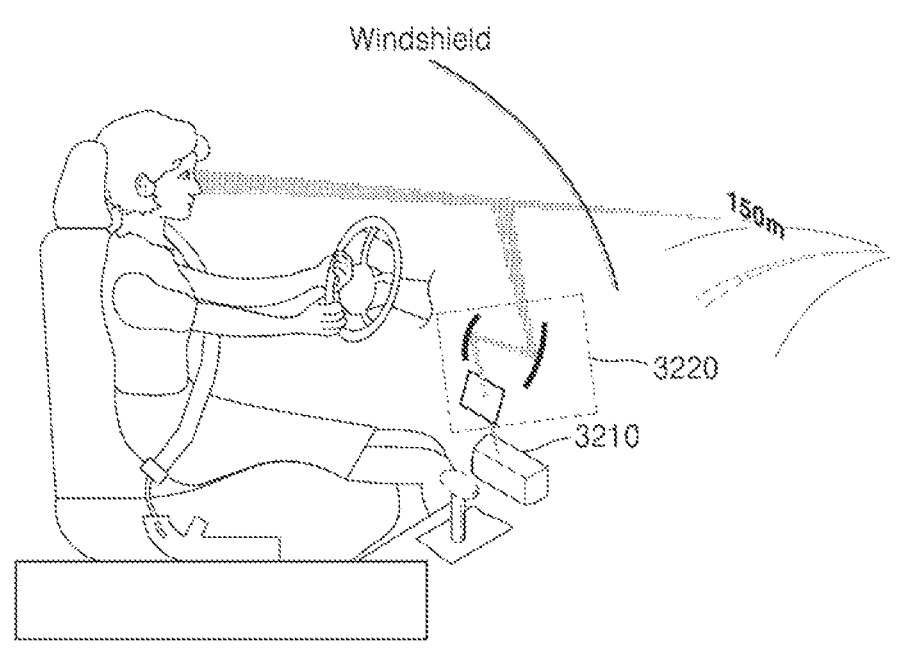
FIG. 26 illustrates an example in which a display device according to an embodiment is applied to a vehicle.

FIG. 26 illustrates an example in which a display device according to an embodiment is applied to a vehicle. The display device may be applied to a head-up display device for a vehicle. The head-up display device may include a display device provided in a region of a vehicle and at least one light path changing member for changing the path of light, such that a driver may see an image generated by the display device 3210.

Figure 27:
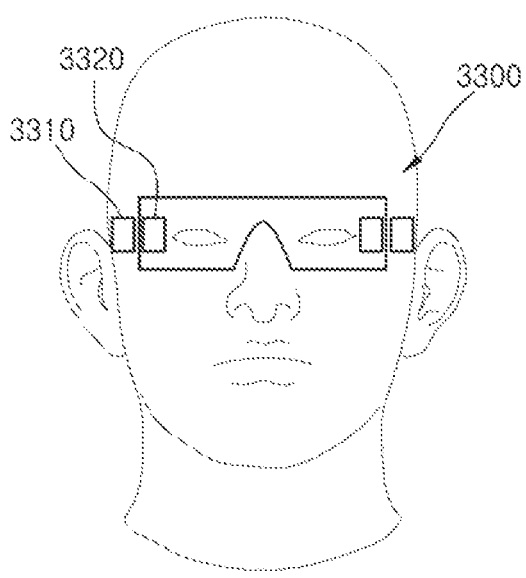
FIG. 27 illustrates an example in which a display device according to an embodiment is applied to augmented reality glasses or virtual reality glasses.

FIG. 27 illustrates an example in which a display device according to an embodiment is applied to augmented reality glasses 3300 or virtual reality glasses. The augmented reality glasses 3300 may include a projection system 3310 that forms an image and at least one guiding element 3320 that guides an image from the projection system 3310 to the eyes of a user. The projection system 3310 may include a display transfer structure.

Figure 28:
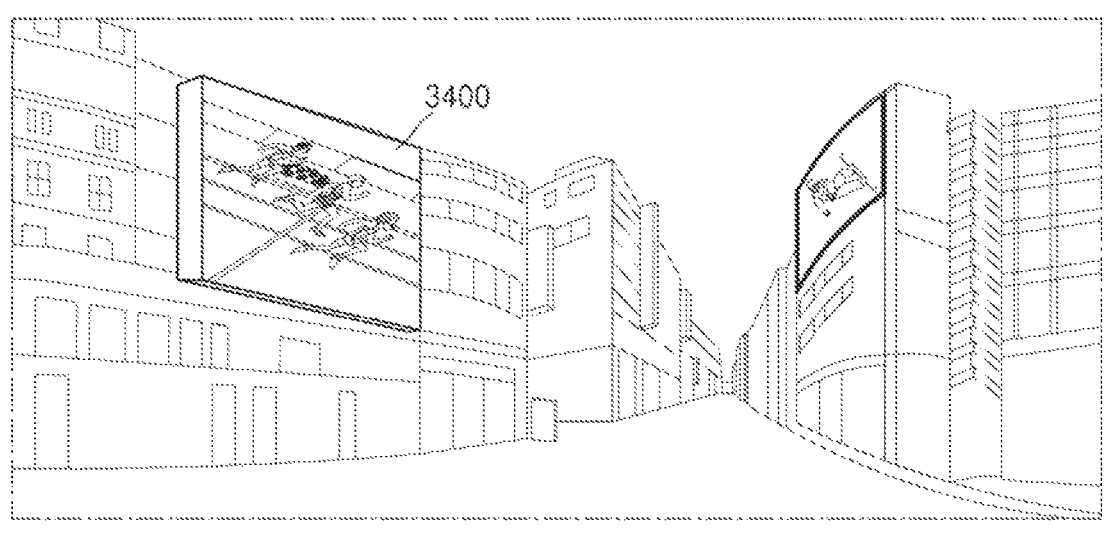
FIG. 28 illustrates an example in which a display device according to an embodiment is applied to a large signage.

FIG. 28 illustrates an example in which a display device according to an embodiment is applied to a signage 3400 that is large. The signage 3400 may be used for outdoor advertisement using a digital information display, and content of advertisements and the like may be controlled through a communication network. The signage 3400 may be implemented, for example, through an electronic device as described with reference to FIG. 24.

Figure 29:
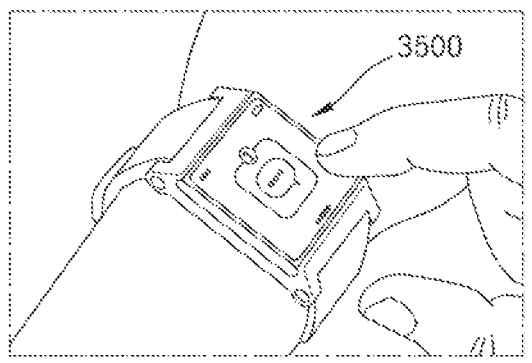
FIG. 29 illustrates an example in which a display device according to an embodiment is applied to a wearable display.

FIG. 29 illustrates an example in which a display device according to an embodiment is applied to a wearable display 3500. The wearable display 3500 may include a display transfer structure and may be implemented through an electronic device as described with reference to FIG. 24.

A display device according to an embodiment may also be applied to various products, such as a rollable TV and a stretchable display.

A method of transferring micro semiconductor chips, according to an embodiment, may efficiently transfer micro semiconductor chips onto a substrate. A method of transferring micro semiconductor chips, according to an embodiment, may stably connect the micro semiconductor chips to a substrate despite differences in sizes or heights of the micro semiconductor chips and differences in depths of grooves formed in the substrate.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A method of transferring a semiconductor chip, the method comprising:
    providing a first substrate having a first surface provided with a plurality of grooves and a second surface opposite to the first surface;
    adhering a support substrate having a higher rigidity than the first substrate to the second surface of the first substrate;
    supplying and aligning a plurality of semiconductor chips respectively to the plurality of grooves of the first substrate;
    disposing a second substrate to face the first surface of the first substrate and partially adhering the second substrate to the first substrate;
    separating the support substrate from the first substrate; and
    adhering the plurality of semiconductor chips to the second substrate by supplying a fluid to a periphery of the second surface and applying a pressure to the second surface.

2. The method of claim 1, wherein the first substrate comprises a base film having a material less rigid than that of the support substrate and a pattern layer disposed on the base film and having a pattern corresponding to the plurality of grooves.

3. The method of claim 2, wherein the base film comprises at least one of polyethylene terephthalate (PET) and polyimide (PI).

4. The method of claim 2, wherein the providing of the first substrate comprises:
    forming a polymer layer on one surface of the base film; and
    forming the pattern corresponding to the plurality of grooves on the polymer layer.

5. The method of claim 4, wherein the plurality of grooves are formed in the polymer layer of the first substrate through an imprinting process.

6. The method of claim 1, wherein:
    the support substrate is adhered to the second surface of the first substrate by using an adhesive layer, and
    the support substrate is separated from the first substrate by weakening adhesive force of the adhesive layer.

7. The method of claim 1, wherein the second substrate is adhered to the first substrate by solder balls arranged in regions between the first substrate and the second substrate.

8. The method of claim 7, wherein the solder balls are partially arranged in edge regions between the first substrate and the second substrate.

9. The method of claim 7, further comprising, after the adhering of the plurality of semiconductor chips to the second substrate, separating the first substrate adhered to the second substrate from the second substrate by weakening an adhering strength of the solder balls.

10. The method of claim 1, further comprising, before the separating of the support substrate from the first substrate, turning upside down an assembly in which the first substrate, the second substrate, and the support substrate are connected to one another, such that the support substrate faces upward.

11. The method of claim 1, wherein the supplying and aligning of the plurality of semiconductor chips are performed according to a fluid self-assembly method.

12. The method of claim 11, wherein the fluid self-assembly method comprises:

supplying a liquid to the plurality of grooves; and aligning the plurality of semiconductor chips with the plurality of grooves by scanning the first substrate by using an absorbing member capable of absorbing the liquid.

13. The method of claim 11, wherein the supplying and aligning of the plurality of semiconductor chips to the plurality of grooves further comprise arranging the plurality of semiconductor chips, such that electrodes of each of the plurality of semiconductor chips face upward.

14. The method of claim 1, wherein a curve is formed on the second surface of the first substrate according to a structure between the second substrate and the first substrate due to the pressure applied to the second surface.

15. The method of claim 14, wherein heights of some of the plurality of semiconductor chips are different from heights of other semiconductor chips of the plurality of semiconductor chips, or depths of some of the plurality of grooves are different from depths of other grooves of the plurality of grooves.

16. The method of claim 14, wherein a gas is supplied at a preset pressure into a chamber in which the first substrate and the second substrate partially adhered to each other are placed, wherein the first substrate is pressed in a direction toward the second substrate by the gas supplied into the chamber, and wherein the plurality of semiconductor chips are in contact with and are pressed against the second substrate.

17. The method of claim 16, wherein the adhering of the plurality of semiconductor chips to the second substrate further comprises heating the plurality of semiconductor chips to be adherable to the second substrate.

18. The method of claim 1, wherein:

the second substrate comprises a driving circuit board comprising a thin-film transistor, and the second substrate and the plurality of semiconductor chips are adhered to and electrically connected to each other.

19. The method of claim 1, wherein the plurality of semiconductor chips comprise at least one of a light-emitting device and a memory chip.

* * * * *